US009941441B2

(12) United States Patent
Anderson et al.

(10) Patent No.: US 9,941,441 B2
(45) Date of Patent: Apr. 10, 2018

(54) STRUCTURAL BONDING COMPOSITIONS AND ATTACHMENT BRACKETS, AND THEIR USE IN PHOTOVOLTAIC SOLAR MODULES

(71) Applicant: 3M INNOVATIVE PROPERTIES COMPANY, Saint Paul, MN (US)

(72) Inventors: Cyrus A. Anderson, White Bear Lake, MN (US); Christopher J. Duda, St. Louis Park, MN (US); Scott R. Meyer, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/512,942

(22) PCT Filed: Sep. 23, 2015

(86) PCT No.: PCT/US2015/051604
§ 371 (c)(1),
(2) Date: Mar. 21, 2017

(87) PCT Pub. No.: WO2016/049116
PCT Pub. Date: Mar. 31, 2016

(65) Prior Publication Data
US 2017/0373216 A1    Dec. 28, 2017

Related U.S. Application Data
(60) Provisional application No. 62/053,943, filed on Sep. 23, 2014.

(51) Int. Cl.
*H01L 31/18* (2006.01)
*C09J 5/06* (2006.01)
*H01L 31/04* (2014.01)

(52) U.S. Cl.
CPC ........... *H01L 31/18* (2013.01); *C09J 5/06* (2013.01); *H01L 31/04* (2013.01);
(Continued)

(58) Field of Classification Search
CPC ..................................................... H01L 31/18
See application file for complete search history.

(56) References Cited

U.S. PATENT DOCUMENTS

| | | | |
|---|---|---|---|
| 6,348,118 B1 | 2/2002 | Johnson | |
| 2012/0211056 A1* | 8/2012 | Chong | F24J 2/5243 136/251 |
| 2015/0047695 A1 | 2/2015 | Schwertfeger | |

FOREIGN PATENT DOCUMENTS

| | | |
|---|---|---|
| JP | H06-151935 | 5/1994 |
| JP | 2011054743 | 3/2011 |
| JP | 2011-113988 | 6/2011 |

OTHER PUBLICATIONS

International Search Report for PCT/US2015/051604 dated Nov. 26, 2015.

(Continued)

*Primary Examiner* — Daniel H Lee
(74) *Attorney, Agent, or Firm* — Eric D. Levinson

(57) ABSTRACT

The present disclosure relates to structural bonding compositions and attachment brackets, and their use in photovoltaic solar modules. Another aspect of the present disclosure relates to methods of affixing an attachment bracket to a solar module during the lamination step used to manufacture the module.

15 Claims, 4 Drawing Sheets

(52) U.S. Cl.
CPC ...... *C09J 2203/322* (2013.01); *C09J 2433/00* (2013.01); *C09J 2463/00* (2013.01)

(56) References Cited

OTHER PUBLICATIONS

International Preliminary Report on Patentability for PCT/US2015/051604 completed on Sep. 26, 2016.

\* cited by examiner

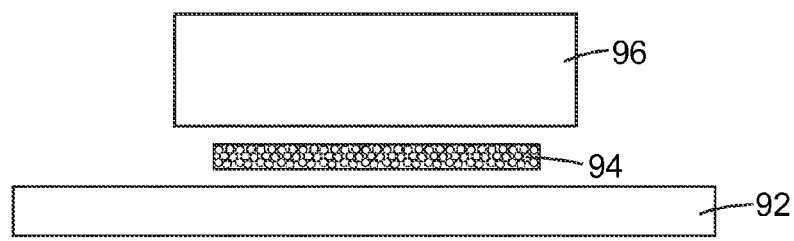
*Fig. 9*
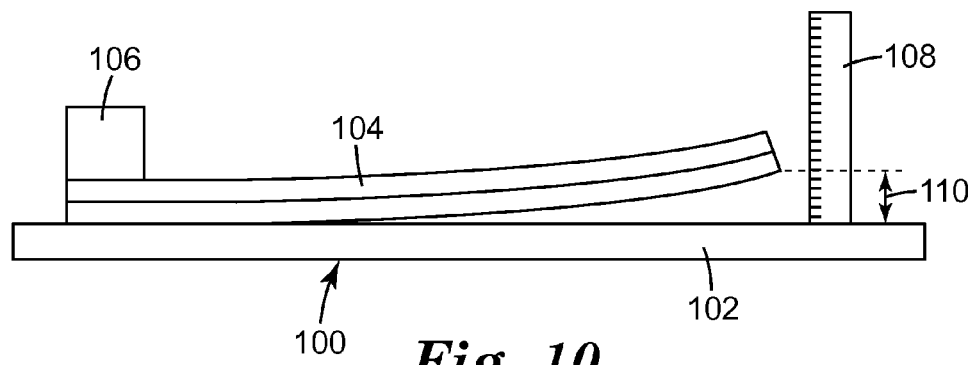
*Fig. 10*
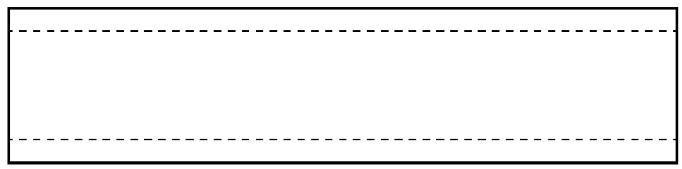
*Fig. 11a*
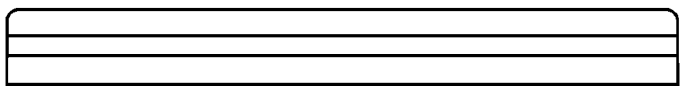
*Fig. 11b*  *Fig. 11c*
*Fig. 12a*
*Fig. 12b*  *Fig. 12c*

US 9,941,441 B2

STRUCTURAL BONDING COMPOSITIONS AND ATTACHMENT BRACKETS, AND THEIR USE IN PHOTOVOLTAIC SOLAR MODULES

CROSS REFERENCE TO RELATED APPLICATIONS

This application is a national stage filing under 35 U.S.C. 371 of International Application No. PCT/US2015/051604, filed Sep. 23, 2015, which claims the benefit of U.S. Provisional Application No. 62/053,943, filed Sep. 23, 2014. The disclosures of both applications are incorporated by reference in their entirety herein.

BACKGROUND

There are currently various methods of installing photovoltaic (PV) solar modules in the field. The applicability of each method depends on field conditions and the type of solar module being installed, among other factors. The two most common rigid solar modules are glass/backsheet modules and glass/glass modules.

Glass/backsheet rigid modules are commonly used for crystalline silicon PV modules. The dominant mounting method for glass/backsheet modules uses metal frames that surround the entire perimeter of the module. These frames typically have a U-channel, where the panel edges are inserted and secured by either a liquid adhesive or a pressure-sensitive adhesive tape.

Glass/glass rigid modules are the dominant type of module in the thin film PV industry. Clips are more common with glass/glass modules than glass/backsheet modules. Clips contact small areas around the edge of the module, and are subjected to the stress of full wind or snow loads. Clip use is sensitive to the specific clip design as module failure can occur in these areas if the clipped area is unable to withstand the applied loads. Multiple clips around the edge can be used to minimize the forces at each clip area. Thicker glass can also help reduce the potential for failure, but may be cost prohibitive.

A third option for mounting solar modules is to use adhesive bonded rails on the back side of the module. The adhesive can be a pressure-sensitive adhesive tape, a liquid, or combination of the two. Rail attachment could be a cost-effective and attractive option for glass/glass modules. A correctly designed rail attachment system can withstand the relevant forces. Rails could be positioned on the back of the module to stiffen and support the module to resist wind and snow loads. 3M™ acrylic foam tapes have been used in solar module rail attachment in the past (see, for example, the photograph of in FIG. 1).

In general, rails are typically attached to the back surface of rigid solar panels, either glass/backsheet or glass/glass, using an adhesive, often in the form of tapes or liquids. Attaching the rails to the solar panel requires additional manufacturing steps and additional costs. In all publicly known cases, the attachment of the rails to the solar module occurs post-manufacturing of the solar module. The present disclosure is directed to a method in which an attachment bracket (such as a rail) can be affixed to a solar module during the lamination process used in the manufacturing of the solar module by using a thermosettable bonding composition.

SUMMARY

In general, the present disclosure relates to structural bonding compositions and attachment brackets, and their use in photovoltaic solar modules. Another aspect of the present disclosure relates to methods of affixing an attachment bracket to a solar module during the lamination step used to manufacture the module. Other aspects of the present disclosure will be described in more detail below and in the following sections.

The solar panel industry needs easy, inexpensive, and durable methods for attaching a PV solar module to the supporting substructure. In the case of glass/glass solar modules, the use of attachment brackets, such as rails, is a suitable option to mount the solar modules onto the substructures. Thus, in one embodiment, the present disclosure is directed to a method of affixing an attachment bracket to a solar module that takes place during the lamination step, utilizing its associated temperature conditions, by affixing an attachment bracket to a pre-lamination solar module via a thermosettable adhesive composition. That lamination step is typically carried out under vacuum conditions, which help create a better contact between the thermosettable adhesive composition and the bonded surfaces than what could be achieved without vacuum. In this embodiment, the thermosettable adhesive composition is cured during the lamination step to produce a complete solar module that already has an attachment bracket bonded to one of its surfaces. The attachment bracket can then be used to mount the solar module to a suitable substructure. Current methods of attaching rails to solar modules typically involve either a hand process or an automated process, where the rail is attached to a completely fabricated solar module without the use of vacuum.

The use of a thermosettable adhesive composition in the method described in the instant embodiment has numerous advantages over current mounting methods. For example, the thermosettable adhesive composition creates a bond that is stronger than that formed by pressure-sensitive adhesive tapes or other liquid adhesives. Liquid adhesives are generally messy, may require long times for curing, and may require the use of a separate tape to provide the initial holding power between the back surface and the rail while the liquid adhesive cures as well as to provide bond line thickness control. Pressure-sensitive adhesive tapes may be simpler and easier to use than liquid adhesives, providing immediate holding power, but are they are generally not as strong and may require priming.

Another embodiment of this invention relates to attachment brackets that can be used in the methods described above and which are designed to eliminate damage or perforations to the laminator or the laminator bladder used to encase the solar module during the lamination step.

All scientific and technical terms used herein have meanings commonly used in the art unless otherwise specified. The definitions provided herein are to facilitate understanding of certain terms used frequently in this application and are not meant to exclude a reasonable interpretation of those terms in the context of the present disclosure.

Unless otherwise indicated, all numbers in the description and the claims expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The recitation of numerical ranges by endpoints includes all numbers subsumed within that range (e.g. a range from 1 to 5 includes, for instance, 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The term "adhesive" as used herein refers to polymeric compositions useful to adhere together two components (adherents). Examples of adhesives include curable adhesives, heat activated adhesives, pressure sensitive adhesives, and combinations thereof. In this disclosure, the term "adhesive" is used interchangeably with the term "adhesive composition."

The term "curable adhesives" as used herein refers to adhesives that contain a curable reaction mixture which cures to form an adhesive bond. Unlike non-curable heat activated adhesives (such as thermoplastic adhesives, which are removable upon the application of heat) and non-curable pressure sensitive adhesives, curable adhesives are generally not removable after curing and are intended to form a permanent bond between two adherends.

The term "pressure sensitive adhesive" as used herein refers to any adhesive that is tacky at room temperature (23° C.).

The term "thermosettable" as used herein refers, in general, to the property of a composition that makes the composition capable of being cured by the administration of heat or suitable radiation.

The term "thermosettable adhesive composition" as used herein refers to a curable adhesive that is capable of being cured by the administration of heat or suitable radiation to the composition.

The term "structural bonding composition" as used herein refers to a thermosettable adhesive composition that has been cured.

The term "glazing pane" as used herein refers to any substrate that can be used as the outermost element in a solar module. Typical glazing panes are made of glass, but other materials, such as polycarbonates or polyesters, can be used as well. In some embodiments, the glazing substrate may also comprise additional layers or treatments. Examples of additional layers include, for example, films designed to provide glare reduction or shatter resistance and the like. Examples of additional treatments that may be present on glazing panes include, for example, coatings, including, but not limited to hardcoats.

The term "polymerization reaction product" as used herein refers to the products that result from the polymerization of one or more reactants. The polymerization reaction may be carried out, for example, by the use of actinic radiation, visible light, heat, moisture cure, and electron beam.

The term "adjacent" refers to the relative position of two elements that are close to each other and may or may not be necessarily in contact with each other. Two elements that are adjacent to each other may or may not have one or more items (such as layers) separating the two elements and its meaning will be understood by the context in which "adjacent" appears.

The term "immediately adjacent" refers to the relative position of two elements that are next to each other and in contact with each other and which have no intermediate layers separating the two elements.

The term "support materials" as used herein refers to any type of material that is miscible with a thermosettable adhesive composition and which can provide structural support to an assembly when the thermosettable adhesive composition is being cured. Examples of support materials include, but are not limited to glass beads, glass bubbles, fibers, wires, non-woven scrims, and meshes.

The term "bowing after 7 days" as used herein refers to the bowing measured seven days after lamination according to the Glass Panel Bowing test described in the "Test Methods" section of the Examples of this disclosure.

The term "stress at 100% strain" as used herein refers to the stress measured according to the Overlap Shear Stress-Strain Measurements described in the "Test Methods" section of the Examples of this disclosure.

The term "pluck adhesion" as used herein refers to the tensile stress according to the Pluck Adhesion test described in the "Test Methods" section of the Examples of this disclosure.

The term "storage modulus" as used herein refers to the tensile storage modulus according to the Storage Modulus test described in the "Test Methods" section of the Examples of this disclosure.

The term "pre-lamination solar module" as used herein refers to a solar module that has all of the basic components of a solar module (those present in a solar module that has just been laminated) but that has not been laminated yet.

The term "solar module mounting portion" on the top surface of the main body of an attachment bracket as used herein refers to the portion of the top surface of the attachment bracket that can be used to receive a solar module.

The term "attachment bracket" as used herein includes any element that can be used to affix a solar module to a substructure or any element that can be used to provide or increase rigidity to the solar module.

The term "substructure mounting portion" on the bottom surface of the main body of an attachment bracket as used herein refers to the portion of the bottom surface that can be used to affix the attachment bracket to a substructure.

In this disclosure, the terms "solar panel" and "solar module" are used interchangeably and have the same meaning.

BRIEF DESCRIPTION OF THE DRAWINGS

FIG. 9 presents an alternative embodiment of the invention.

FIG. 10 illustrates a method of measuring bowing.

FIG. 11 presents three views of an embodiment of the invention.

FIG. 12 presents three views of an embodiment of the invention.

ELEMENT NUMBERS

Figure 1:
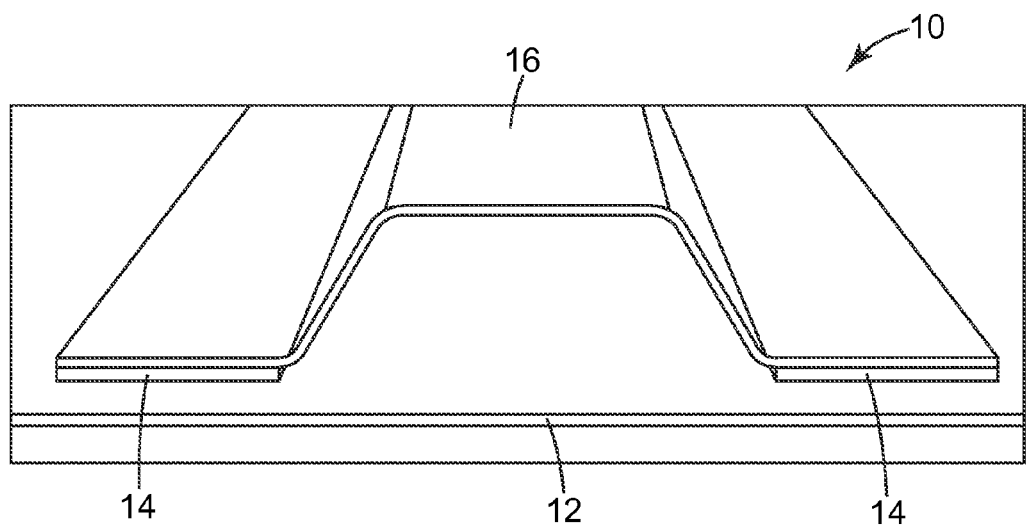
FIG. 1 is a photograph of an attachment bracket bonded to a glass surface.
Figure 2:
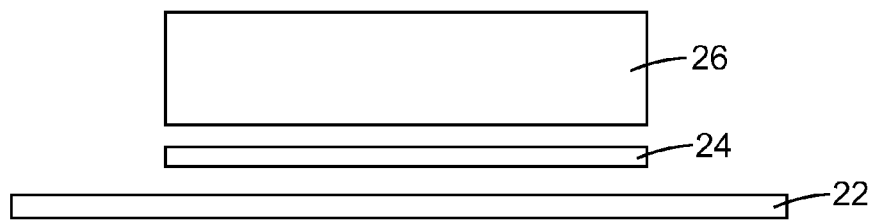
FIG. 2 is a schematic view of an embodiment of the invention.
Figure 3:
FIG. 3 is a schematic view of an attachment bracket bonded to the glass surface of a photovoltaic module.
Figure 4:
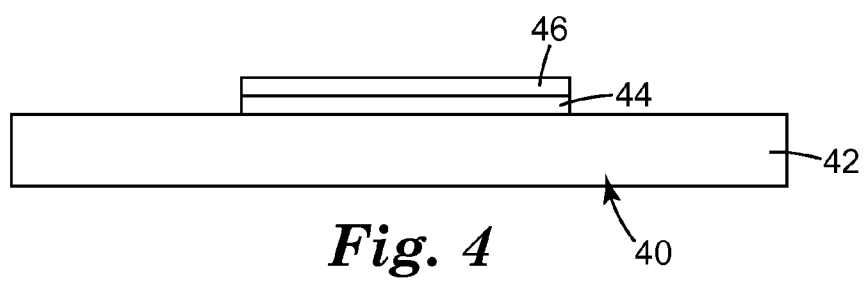
FIG. 4 is a schematic view of an alternative embodiment of the invention.
Figure 5:
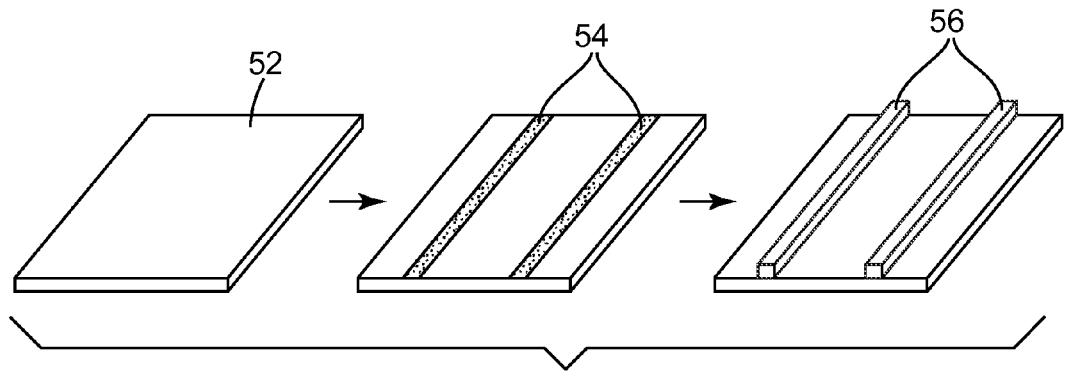
FIG. 5 presents a process for assembling an embodiment of the invention.

10 Photograph of an attachment bracket bonded to glass.
12 Glass.
14 Adhesive.
16 Attachment bracket.
22 Major surface of glazing of a photovoltaic module.
24 Structural bonding composition.
26 Attachment bracket.
30 Assembly comprising an attachment bracket bonded to a glazing surface of a photovoltaic module with structural bonding composition.
32 Glazing.
34 Structural bonding composition.
36 Attachment bracket.
40 Alternative embodiment of an assembly comprising an attachment bracket bonded to a glazing surface of a photovoltaic module with structural bonding composition.
42 Glazing.
44 Structural bonding composition.
46 Attachment bracket.
52 Glazing.
54 Structural bonding composition.
56 Attachment brackets placed on structural bonding composition.
60 Assembly in contact with bladder of laminator.
62 Glazing.
64 Structural bonding composition.
66 Attachment bracket.
68 Bladder of laminator.
70 Alternative embodiment of an assembly in contact with bladder of laminator.
72 Glazing.
74 Structural bonding composition.
76 Attachment bracket.
78 Bladder of laminator.
82 Glazing.
84 Structural bonding composition.
86 Attachment bracket with bottom channel for structural bonding composition.
92 Glazing.
94 Structural bonding composition combined with support materials.
100 Apparatus for measuring bowing of attachment bracket bonded to glass with structural bonding composition.
102 Bench top.
104 Assembly comprising attachment bracket bonded to glazing with structural bonding composition.
106 Four kilogram weight.
108 Ruler.
110 Distance assembly has bowed.
140 Assembly used to measure pluck adhesion.
142 Glazing.
144 Structural bonding composition.
146 Aluminum block.
148 Metal fixture.

DETAILED DESCRIPTION

As mentioned above, rails have been attached to glass/glass solar modules by the use of commercially-available acrylic tapes in processes that occur post-manufacture of the solar modules. The inventors have also discovered that certain thermosetting epoxy formulations do not provide enough compensation for the coefficient of thermal expansion (CTE) mismatch that exists between the metal rail and the glass or polymer back surface of the solar module.

This thermal expansion mismatch is a potential problem for the use of commercially-available structural bonding tapes. The metal rails and back surfaces (glass or polymer) have different coefficients of thermal expansion (CTE). Typical CTEs are shown below for common solar panel materials. Note: units for CTE are micron/m-deg C.

| Material | CTE (μm/m-° C.) | Panel Location |
| --- | --- | --- |
| Aluminum | 22.2 | Rail or Frame |
| PC (filled) | 21.5 | Junction Box |
| Galv Steel | 11.7 | Rail or Frame |
| Glass | 9.0 | Back Surface |
| Tedlar | 50.4 | Back Surface |

As an example, the mismatch between a 2 m aluminum rail and a 2 m sheet of glass would be about 0.2% after increasing the temperature from 25 C to 150° C., which is the approximate lamination temperature of a PV solar module.

This CTE mismatch can produce bowing of the module because the two bonded surfaces expand by different amounts. Bowing can create stresses inside a solar module that may damage the PV cells or break the glass that protects the module.

During the vacuum lamination process used in the manufacture of solar modules, the various materials expand to different lengths as the temperature increases. If a thermosettable adhesive composition is used in the process, the composition will cure while the materials are expanding at different rates and, consequently, having different lengths. After lamination, the elements of the solar module will cool and return to their initial lengths. This cooling process produces tensile and compressive stresses within the module that can produce bowing if the adhesive is not able to accommodate the change in lengths.

The inventors have developed thermosettable adhesive compositions with viscoelastic and structural properties that are suitable for bonding metal attachment brackets to the glass of a solar module during a lamination step.

The thermosettable adhesive compositions disclosed herein have features that are useful for railbonding and junction box attachment. In one embodiment, the thermosettable adhesive composition is used to bond the attachment bracket (such as a rail) or junction box to the back surface of the module prior to lamination. The thermosettable adhesive composition is cured during the vacuum lamination step to produce a much stronger bond than could be achieved with a liquid sealant or acrylic foam tape. In other embodiments, the thermosettable adhesive composition changes color (e.g., from black to matte grey) to show that the composition has cured. This provides a quality assurance benefit for solar manufacturers who could ensure that the thermosettable adhesive composition has been cured during the lamination step. The inventors have confirmed that typical panel lamination conditions (e.g., temperature and time) are sufficient to cure the thermosettable adhesive composition.

The lamination step for the preparation of solar module typically includes vacuum. However, vacuum is not necessarily required to cure the thermosettable adhesive composition disclose herein. A typical lamination process for thin-film glass-glass modules might be 150° C. for 10-15 minutes to allow time for the encapsulant materials to cure, thereby bonding the glass, encapsulant, and cells.

Typical benefits of the methods disclose herein include:
1) Quick and easy installation by sliding into holders,
2) Simplified manufacturing process, and
3) Improved wet out and adhesion by curing the thermosettable adhesive composition during the vacuum lamination process.

Various embodiments of this disclosure will be mentioned below to exemplify their use. In one embodiment, the present disclosure is directed to a method of affixing an attachment bracket to a solar module comprising:
  providing a pre-lamination solar module comprising:
    one or more photovoltaic cells each comprising a first major surface and a second major surface,
    a glazing pane adjacent one of the major surfaces of the one or more photovoltaic cells,
  providing an attachment bracket,
  providing a thermosettable adhesive composition,
  forming a solar module assembly by positioning the thermosettable adhesive composition between the glazing pane of the pre-lamination solar module and the attachment bracket, and
  heating the solar module assembly, thereby forming a bond between the glazing pane and the attachment bracket via the thermosettable adhesive composition.

In other embodiments, the thermosettable adhesive composition used in the methods of affixing an attachment bracket to a solar module, comprises an intermediate bonding composition, wherein the intermediate bonding composition comprises:
  a thermosettable epoxy composition comprising one or more epoxy resins, and
  an acrylic composition comprising the polymerization reaction product of a mixture comprising:
    an acrylic ester, and
    a polymerizable monomer.

In other embodiments, the present disclosure is directed to solar modules comprising:
  one or more photovoltaic cells, each comprising a first major surface and a second major surface,
  a glazing pane adjacent one of the major surfaces of the one or more photovoltaic cells,
  an attachment bracket, and
  a structural bonding composition adhesively bonding the attachment bracket to the glazing pane,
  wherein the structural bonding composition comprises the polymerization reaction product of an intermediate bonding composition, wherein the intermediate bonding composition comprises:
    a thermosettable epoxy composition comprising one or more epoxy resins, and
    an acrylic composition comprising the polymerization reaction product of a mixture comprising:
      an acrylic ester, and
      a polymerizable monomer.

Thermosettable Adhesive Compositions

In certain embodiments, the thermosettable adhesive composition useful in the methods disclosed herein comprises both thermosettable epoxy compositions, acrylate compositions, and optionally a coloring agent. In other embodiments, the thermosettable adhesive composition further comprises an organofunctional silane. In other embodiments, the acrylic composition comprises the polymerization reaction product of a mixture comprising an acrylic ester, and a polymerizable monomer.

In some embodiments, the epoxy moiety comprises from about 20 to 150 parts by weight per one hundred parts of acrylate, i.e., the acrylate and the co-polymerizable monomers, and preferably from 40 to 120 parts epoxy per one hundred parts of acrylate, and more preferably 60 to 100 parts of epoxy per one hundred parts of acrylate. In a highly preferred composition, the pigment comprises a carbon black or graphite pigment.

Preferred acrylic materials include photopolymerizable prepolymeric or monomeric acrylate mixtures. Useful acrylic materials include monoethyleneically unsaturated monomers that have a homopolymer glass transition temperature less than 0 C. Preferred monomers are monofunctional acrylic or methacrylic esters of non-tertiary alkyl alcohols having from 2 to 20 carbon atoms, and preferably from 4 to 12 carbon atoms in the alkyl moiety. Useful esters include n-butyl acrylate, hexyl acrylate, 2-ethylhexyl acrylate, octyl acrylate, dodecyl acrylate, lauryl acrylate, octadecyl acrylate, and mixtures thereof.

The acrylate moiety may optionally include a co-polymerizable reinforcing monomer. The reinforcing monomer is selected to have a higher homopolymer glass transition temperature than a homopolymer of only the acrylate monomer. Useful reinforcing monomers include isobornyl acrylate, N-vinyl pyrrolidone, N-vinyl caprolactam, N-vinyl piperidine, N,N-dimethylacrylamide, and acrylonitrile.

A small amount of an acidic monomer, such as acrylic acid, may also be included in the acrylic moiety as long as it does not negatively affect the curing of the epoxy moiety or the desired overall performance of the adhesive. If used, the amount of acid is preferably less than about 2 percent by weight of the acrylic moiety, i.e., the total weight of the acrylate, the co-polymerizable reinforcing monomer, and the acidic monomer.

When the prepolymeric or monomeric mixture includes both an acrylate and a reinforcing monomer, the acrylate will generally be present in an amount of about 50 to 95 parts by and the reinforcing monomer will be present in a corresponding amount of 50 to 5 parts by weight.

The adhesive compositions also preferably include a free radical photoinitiator that is activatable by ultraviolet radiation. An example of useful photoinitiator is benzil dimethyl ketal (Irgacure™ 651 available from Ciba Geigy). The photoinitiator is typically used in amounts from about 0.01 to 5 parts by weight per 100 parts of the acrylate monomers.

In other embodiments, the thermosettable adhesive compositions also include an acrylate cross-linking agent. The cross-linking agent increases the modulus of the adhesive in the pressure-sensitive state so that when it is used to bond an object to a surface with pressure either from the weight of the object or from an external source it resists flowing out and around the object during thermal curing. Useful crosslinking agents are those that are free-radically polymerizable from acrylate monomers such as divinyl ethers and multifunctional acrylates that do not interfere with the curing of the epoxy resin. Examples of multi-functional acrylates include, but are not limited to, 1,6-hexanediol diacrylate, tri-methylol-propane triacrylate, pentaerythritol tetraacrylate, and 1,2-ethylene glycol diacrylate. Amounts up to about 1 part per 100 parts acrylate monomers are preferred, and amounts of 0.01 to 0.2 part are preferred.

Useful epoxy resins are selected from the group of compounds that contain an average of more than one, and preferably at least two epoxy groups per molecule. The epoxy resin can be either solid, semi-solid, or liquid at room temperature. Combinations of different types of epoxy resins can be used. Representative epoxy resins include, but are not limited to phenolic epoxy resins, bisphenol epoxy resins, hydrogenated epoxy resins, aliphatic epoxy resins, halogenated bisphenol epoxy resins, novalac epoxy resins, and mixtures thereof. Preferred epoxy resins are those formed by the reaction of bisphenol-A with epichlorohydrin. Examples of commercially available epoxy resins include Epon™ 828 and Epon™ 1001.

The epoxy resins are cured with any type of an epoxy hardener, preferably a heat activatable hardener. The hardener is included in an amount sufficient to affect the curing of the epoxy under heat. Preferably, the hardener is selected from the group comprising dicyandiamide or polyamine salts. The heat activatable hardener will typically be used in an amount of about 0.1 to 20 parts by weight, and preferably 0.5 to 10 parts by weight per 100 parts by weight of the acrylate monomers.

In cases where the oven curing temperatures may be insufficient to fully cure the epoxy resin, it is useful to include an accelerator in the adhesive composition before making the sheet material so that the resin can fully cure at a lower temperature, or within a shorter period of time. Imidazoles and urea derivatives are particularly preferred as accelerators because of their ability to extend the shelf life of the sheet materials. Examples of preferred imidazoles are 2,4-diamino-6-(2'-methyl-imidazoyl)-ethyl-s-triazine isocyanurate, 2-phenyl-4-benzyl-5-hydroxymethylimidazole, 2,4-dimaino-6(2'-methyl-imidazoyl)-ethyl-s-triazine, hexakis (imidazole)nickel phthalate, and toluene bisdimethylurea. An accelerator may be used in amounts up to about 20 parts by weight per 100 parts by weight of the acrylate monomers.

In a preferred embodiment, the pigment that is selected for modifying the adhesive formulation preferably exhibits good light transmittance below 400 nm. Light transmittance is pigment concentration dependent; the higher the loading of pigment, the lower the amount of light that will be capable of penetrating into the center of the adhesive mass. Light transmittance may be measured using a UV-visible spectrophotometer such as Hewlett Packard HP8452A UV-visible Diode Array Spectrophotometer. In practice, the amount of light transmittance below 400 nm should be measurable (i.e., >0%), especially in the region where the photoinitiator exhibits absorbence. This insures that detectable light energy is penetrating through the thickness of the adhesive mass and allowing the absorption characteristics of the photoinitiator to perform its initiation function by absorbing light energy.

Preferred pigments include carbon black, and graphite pigments. A useful commercially available pigment is an 18% graphite dispersion in phenyloxyacrylate sold under the tradename Penncolor™ 96117 by Penncolor, Doylestown, Pa.

Both carbon black and graphite exhibit uniform transmittance as a function of wavelength through the visible and UV regions of the electromagnetic spectrum. They also exhibit a decrease in transmittance as pigment concentration increases.

In a preferred embodiment, the adhesive of the invention also includes an organofunctional silane.

Silanes have the following general formula

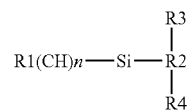

Useful silanes include those having the following organic functionalities wherein R1 is either vinyl, halogen, epoxy, acrylate, methacrylate, amine, mercapto, styryl or ureido; and R2, R3, and R4 is halo, methoxy, ethoxy, propoxy, or beta-methoxyethoxy; and n is an integer between 0 and 8. Organofunctional silanes are commercially available from such sources as Evonik Industries. The silanes are incorporated in a fashion as to impart specific performance and visual characteristics to the tape construction. Most silanes participate exclusively in either the UV or thermal curing steps. The silanes may participate in both the UV and thermal curing steps if a combination of silanes are used, or if the particular silane happens to have functionalities that participate in both curing steps.

The silanes are used in amounts sufficient to affect the desired properties. The specific function of the silane is to alter the tape properties after UV cure or after the thermal curing step. One such property is the modulus or stiffness of the adhesive, which can be changed from a semi-structural adhesive to a structural adhesive simply by incorporation of a silane. Another property improved by the use of silanes is adhesion of the composition to glass.

In one embodiment, the method for manufacturing the thermosettable adhesive compositions if a tape is desired involves four distinct steps. The first step involves the dissolving, blending, and dispersion of the epoxy resins and curatives in the acrylate monomers or syrup along with any fillers and silanes. The second step involves coating the compounded formulation on a single support liner, or between two liners to a given thickness and exposing the formulation to curing radiation. Enough radiation should be used to achieve an overall nonvolatile content that is >95%, as measured by thermogravimetric analysis. The third step involves converting the tape to rolls and assembly of the tape to the adherends. The final step involves exposing the bonded assembly to heat which initiates the epoxy curing mechanism and results in conversion and gellation of the epoxy portion of the composition. During this step phase separation of the epoxy occurs resulting in a two-phase morphology. The formation of two-phase morphology is what is believed to cause the shade change in the tape construction through a scattering mechanism. The function of the silanes is to specifically adjust and tailor this phase separation, and resulting domain size in such a fashion as to achieve specific target properties in the final tape construction.

U.S. Pat. Nos. 5,086,088 and 6,348,118 describe useful thermosettable adhesive compositions that can be used in the methods of this disclosure. U.S. Pat. Nos. 5,086,088 and 6,348,118 are incorporated herein by reference for their disclosure of thermosettable adhesive compositions comprising from 10% to 40% of the thermosettable epoxy composition by weight with respect to the total weight of the bonding composition that comprises the epoxy component and the acrylic component.

Attachment Brackets

The attachment brackets (e.g., rails) of the present disclosure are designed such that they will not damage or perforate the vacuum laminator bladder. In one embodiment, the attachment brackets have a relatively low profile such that they do not protrude significantly from the glass surface of the solar module to which they are attached.

The present inventors have discovered that the heights and shapes of attachment brackets used in a typical vacuum laminator can have unexpected effects on the laminator, including potentially causing laminator failure due to puncture of the laminator bladder. Thus, one embodiment of the present disclosure is directed to attachment brackets of particular design that do not damage or perforate the laminator (e.g., the laminator bladder). As shown in the Examples, the inventors discovered a relationship between the height of an attachment bracket and how round the edges (or the corners) of the surface that is in contact with the laminator bladder should be to provide a successful attachment bracket/solar module bond.

Thus, other embodiments of this disclosure encompass using rounded attachment brackets (made of metal, an alloy, or another suitable material) or rounded edges on the junction boxes to reduce wear and tear on the vacuum laminator bladder during the vacuum cycle of the lamination process. Sharp corners could result in damage to the bladders and require equipment down-time to replace torn bladders. This rounded edge approach could be used with acrylic foam tape (AFT) too, but would not eliminate the need for priming the back of the solar panel or the attachment bracket.

In certain embodiments, the portions of the attachment bracket that are rounded are the edges of the surface of the attachment bracket that is in contact with the laminator. One of ordinary skill in the art would understand that due to the variety of designs available for laminators and the materials used in laminator bladders, certain attachment brackets that would be unsuccessful (e.g. puncture a bladder) in a particular laminator would be suitable for use in other laminators. Thus, the particular dimensions of the attachment brackets of the present disclosure depend on the characteristics of the given laminator being used.

A typical attachment bracket of this disclosure is a rail, such as those used for mounting solar module to substructures. However, other elements that would not be considered typical rails can also serve as attachment brackets as long as they can support the weight of the solar module and can attach the solar module to the substructure.

In other embodiments, the attachment bracket, which can include rails, comprises:
  a main body having a top surface and a bottom surface,
  at least one solar module mounting portion on the top surface of the main body configured to receive a solar module on the attachment bracket,
  at least one substructure mounting portion on the bottom surface of the main body configured to attach to a substructure,
  wherein the main body of the attachment bracket has a height,
  wherein the substructure mounting portion on the bottom surface of the main body has at least one bottom edge,
  wherein the at least one bottom edge is rounded.

In some embodiments, the at least one substructure mounting portion on the bottom surface of the main body of the attachment bracket has four sides, wherein the bottom surface of the main body has a width and a length and has four bottom edges, one edge along each of the four sides,
  wherein each of the two bottom edges along the length of the bottom surface defines a longitudinal bottom edge,
  wherein each of the two bottom edges along the width of the bottom surface defines a lateral bottom edge,
  wherein the two longitudinal bottom edges and the two lateral bottom edges are rounded,
  wherein a bottom corner is formed wherever a longitudinal bottom edge meets a lateral bottom edge, and
  wherein each bottom corner in the attachment bracket is rounded.

Exemplary Embodiments

The following exemplary embodiments are included herein to provide more context and to illustrate the variety of potential applications of the present disclosure but are not to be considered limiting of the scope of the included claims.

Exemplary Assembly Embodiments

A. An assembly comprising:
  a glazing pane,
  an attachment bracket, and
  a structural bonding composition adhesively bonding the attachment bracket to the glazing pane,
  wherein the structural bonding composition comprises the polymerization reaction product of an intermediate bonding composition, wherein the intermediate bonding composition comprises:
    a thermosettable epoxy composition comprising one or more epoxy resins, and
    an acrylic composition comprising the polymerization reaction product of a mixture comprising:
      an acrylic ester, and
      a polymerizable monomer.

B. The assembly according to any of the preceding embodiments directed to assemblies, wherein the intermediate bonding composition is a pressure sensitive adhesive.

C. The assembly according to any of the preceding embodiments directed to assemblies, wherein the thermosettable epoxy composition comprises one or more epoxy resins each comprising at least two epoxy groups per molecule.

D. The assembly according to any of the preceding embodiments directed to assemblies, wherein the thermosettable epoxy composition comprises one or more epoxy resins each chosen independently from phenolic epoxy resins, bisphenol epoxy resins, hydrogenated epoxy resins, aliphatic epoxy resins, halogenated bisphenol epoxy resins, novalac epoxy resins, and mixtures thereof.

E. The assembly according to any of the preceding embodiments directed to assemblies, wherein the thermosettable epoxy composition comprises one or more epoxy resins each chosen independently from bisphenol epoxy resins.

F. The assembly according to any of the preceding embodiments directed to assemblies, wherein the thermosettable epoxy composition comprises one or more epoxy resins each comprising di(glycidyl ether) of bisphenol A.

G. The assembly according to any of the preceding embodiments directed to assemblies, wherein the acrylic ester in the acrylic composition is chosen from monofunctional acrylic and methacrylic esters of non-tertiary alkyl alcohols having from 2 to 20 carbon atoms.

H. The assembly according to any of the preceding embodiments directed to assemblies, wherein the acrylic ester in the acrylic composition is chosen from monofunctional acrylic and methacrylic esters of non-tertiary alkyl alcohols having from 4 to 20 carbon atoms.

I. The assembly according to any of the preceding embodiments directed to assemblies, wherein the acrylic ester in the acrylic composition is chosen from n-butyl acrylate, hexyl acrylate, 2-ethylhexyl acrylate, octyl acrylate, dodecyl acrylate, lauryl acrylate, octadecyl acrylate, and mixtures thereof.

J. The assembly according to any of the preceding embodiments directed to assemblies, wherein the polymerizable monomer in the acrylic composition is chosen from isobornyl acrylate, N-vinyl pyrrolidone, N-vinyl caprolactam, N-vinyl piperidine, N,N-dimethylacrylamide, acrylonitrile, and mixtures thereof.

K. The assembly according to any of the preceding embodiments directed to assemblies, wherein the acrylic composition comprises butyl acrylate and N-vinyl caprolactam.

L. The assembly according to any of the preceding embodiments directed to assemblies, wherein the acrylic composition further comprises an acrylate crosslinking agent.

M. The assembly according to any of the preceding embodiments directed to assemblies, wherein the acrylic composition further comprises an acrylate crosslinking agent chosen from divinyl ethers and multi-functional acrylates.

N. The assembly according to any of the preceding embodiments directed to assemblies, wherein the acrylic composition further comprises an acrylate crosslinking agent chosen from 1,6-hexanediol diacrylate, tri-methylol-propane triacrylate, pentaerythritol tetraacrylate, 1,2-ethylene glycol diacrylate, 2-hydroxy-3-phenoxy propyl acrylate, and mixtures thereof.

O. The assembly according to any of the preceding embodiments directed to assemblies, wherein the intermediate bonding composition further comprises one or more photoinitiators.

P. The assembly according to any of the preceding embodiments directed to assemblies, wherein the intermediate bonding composition further comprises benzyl dimethyl ketal.

Q. The assembly according to any of the preceding embodiments directed to assemblies, wherein the intermediate bonding composition further comprises one or more adhesion promoters.

R. The assembly according to any of the preceding embodiments directed to assemblies, wherein the intermediate bonding composition further comprises one or more adhesion promoters chosen from organofunctional silanes.

S. The assembly according to any of the preceding embodiments directed to assemblies, wherein the intermediate bonding composition further comprises one or more additives chosen from hardeners, pigments, curative agents, curing accelerators, and fillers.

T. The assembly according to any of the preceding embodiments directed to assemblies, wherein the structural bonding composition further comprises one or more support materials.

U. The assembly according to any of the preceding embodiments directed to assemblies, wherein the structural bonding composition further comprises one or more support materials chosen from glass beads, glass bubbles, fibers, wires, non-woven scrims, and meshes.

V. The assembly according to any of the preceding embodiments directed to assemblies, wherein the structural bonding composition has a thickness from 0.1 mm to 4 mm.

W. The assembly according to any of the preceding embodiments directed to assemblies, wherein the structural bonding composition has a thickness from 0.2 mm to 2 mm.

X. The assembly according to any of the preceding embodiments directed to assemblies, wherein the structural bonding composition has a thickness from 0.3 mm to 1 mm.

Y. The assembly according to any of the preceding embodiments directed to assemblies, wherein the assembly shows bowing after 7 days in the glass panel bowing test from 0 mm to 2.5 mm.

Z. The assembly according to any of the preceding embodiments directed to assemblies, wherein the assembly shows bowing after 7 days in the glass panel bowing test from 0 mm to 2.0 mm.

AA. The assembly according to any of the preceding embodiments directed to assemblies, wherein the assembly shows bowing after 7 days in the glass panel bowing test from 0 mm to 1.5 mm.

BB. The assembly according to any of the preceding embodiments directed to assemblies, wherein the assembly shows bowing after 7 days in the glass panel bowing test from 0 mm to 1.0 mm.

CC. The assembly according to any of the preceding embodiments directed to assemblies, wherein the assembly shows bowing after 7 days in the glass panel bowing test from 0 mm to 0.5 mm.

DD. The assembly according to any of the preceding embodiments directed to assemblies, wherein the structural bonding composition has a stress at 100% strain in the overlap shear stress strain test from 0 $N/cm^2$ to 150$N/cm^2$.

EE. The assembly according to any of the preceding embodiments directed to assemblies, wherein the structural bonding composition has a stress at 100% strain in the overlap shear stress strain test from 0 $N/cm^2$ to 130$N/cm^2$.

FF. The assembly according to any of the preceding embodiments directed to assemblies, wherein the structural bonding composition has a stress at 100% strain in the overlap shear stress strain test from 0 $N/cm^2$ to 100$N/cm^2$.

GG. The assembly according to any of the preceding embodiments directed to assemblies, wherein the structural bonding composition has a stress at 100% strain in the overlap shear stress strain test from 0 $N/cm^2$ to 75$N/cm^2$.

HH. The assembly according to any of the preceding embodiments directed to assemblies, wherein the structural bonding composition has a stress at 100% strain in the overlap shear stress strain test from 0 $N/cm^2$ to 50$N/cm^2$.

II. The assembly according to any of the preceding embodiments directed to assemblies, wherein the structural bonding composition has a pluck adhesion in the pluck adhesion test from 35 $N/cm^2$ to 350 $N/cm^2$.

JJ. The assembly according to any of the preceding embodiments directed to assemblies, wherein the structural bonding composition has a pluck adhesion in the pluck adhesion test from 50 $N/cm^2$ to 350 $N/cm^2$.

KK. The assembly according to any of the preceding embodiments directed to assemblies, wherein the structural bonding composition has a pluck adhesion in the pluck adhesion test from 75 $N/cm^2$ to 350 $N/cm^2$.

LL. The assembly according to any of the preceding embodiments directed to assemblies, wherein the structural bonding composition has a pluck adhesion in the pluck adhesion test from 100$N/cm^2$ to 350 $N/cm^2$.

MM. The assembly according to any of the preceding embodiments directed to assemblies, wherein the structural bonding composition has a pluck adhesion in the pluck adhesion test from 110 N/cm² to 350 N/cm².

NN. The assembly according to any of the preceding embodiments directed to assemblies, wherein the structural bonding composition has a pluck adhesion in the pluck adhesion test from 140 N/cm² to 350 N/cm².

OO. The assembly according to any of the preceding embodiments directed to assemblies, wherein the structural bonding composition has a pluck adhesion in the pluck adhesion test from 150 N/cm² to 350 N/cm².

PP. The assembly according to any of the preceding embodiments directed to assemblies, wherein the structural bonding composition has a pluck adhesion in the pluck adhesion test from 200 N/cm² to 350 N/cm².

QQ. The assembly according to any of the preceding embodiments directed to assemblies, wherein the structural bonding composition has a pluck adhesion in the pluck adhesion test greater than 35 N/cm².

RR. The assembly according to any of the preceding embodiments directed to assemblies, wherein the structural bonding composition has a pluck adhesion in the pluck adhesion test greater than 50 N/cm².

SS. The assembly according to any of the preceding embodiments directed to assemblies, wherein the structural bonding composition has a pluck adhesion in the pluck adhesion test greater than 75 N/cm².

TT. The assembly according to any of the preceding embodiments directed to assemblies, wherein the structural bonding composition has a pluck adhesion in the pluck adhesion test greater than 100N/cm².

UU. The assembly according to any of the preceding embodiments directed to assemblies, wherein the structural bonding composition has a pluck adhesion in the pluck adhesion test greater than 110 N/cm².

VV. The assembly according to any of the preceding embodiments directed to assemblies, wherein the structural bonding composition has a pluck adhesion in the pluck adhesion test greater than 140 N/cm².

WW. The assembly according to any of the preceding embodiments directed to assemblies, wherein the structural bonding composition has a pluck adhesion in the pluck adhesion test greater than 150 N/cm².

XX. The assembly according to any of the preceding embodiments directed to assemblies, wherein the structural bonding composition has a pluck adhesion in the pluck adhesion test greater than 200 N/cm².

YY. The assembly according to any of the preceding embodiments directed to assemblies, wherein the structural bonding composition has a storage modulus at 25° C. from 0.5 MPa to 30 MPa.

ZZ. The assembly according to any of the preceding embodiments directed to assemblies, wherein the structural bonding composition has a storage modulus at 25° C. from 0.5 MPa to 25 MPa.

AAA. The assembly according to any of the preceding embodiments directed to assemblies, wherein the structural bonding composition has a storage modulus at 25° C. from 0.5 MPa to 20 MPa.

BBB. The assembly according to any of the preceding embodiments directed to assemblies, wherein the structural bonding composition has a storage modulus at 25° C. from 1 MPa to 15 MPa.

CCC. The assembly according to any of the preceding embodiments directed to assemblies, wherein the intermediate bonding composition comprises from 10% to 40% of the thermosettable epoxy composition by weight with respect to the total weight of the intermediate bonding composition.

DDD. The assembly according to any of the preceding embodiments directed to assemblies, wherein the intermediate bonding composition comprises from 15% to 35% of the thermosettable epoxy composition by weight with respect to the total weight of the intermediate bonding composition.

EEE. The assembly according to any of the preceding embodiments directed to assemblies, wherein the intermediate bonding composition comprises from 20% to 30% of the thermosettable epoxy composition by weight with respect to the total weight of the intermediate bonding composition.

Exemplary Solar Module Embodiments

A. A solar module comprising:
one or more photovoltaic cells, each comprising a first major surface and a second major surface,
a glazing pane adjacent one of the major surfaces of the one or more photovoltaic cells,
an attachment bracket, and
a structural bonding composition adhesively bonding the attachment bracket to the glazing pane,
wherein the structural bonding composition comprises the polymerization reaction product of an intermediate bonding composition, wherein the intermediate bonding composition comprises:
a thermosettable epoxy composition comprising one or more epoxy resins, and
an acrylic composition comprising the polymerization reaction product of a mixture comprising:
an acrylic ester, and
a polymerizable monomer.

B. The solar module according to any of the preceding embodiments directed to solar modules, wherein the intermediate bonding composition is a pressure sensitive adhesive.

C. The solar module according to any of the preceding embodiments directed to solar modules, wherein the thermosettable epoxy composition comprises one or more epoxy resins each comprising at least two epoxy groups per molecule.

D. The solar module according to any of the preceding embodiments directed to solar modules, wherein the thermosettable epoxy composition comprises one or more epoxy resins each chosen independently from phenolic epoxy resins, bisphenol epoxy resins, hydrogenated epoxy resins, aliphatic epoxy resins, halogenated bisphenol epoxy resins, novalac epoxy resins, and mixtures thereof.

E. The solar module according to any of the preceding embodiments directed to solar modules, wherein the thermosettable epoxy composition comprises one or more epoxy resins each chosen independently from bisphenol epoxy resins.

F. The solar module according to any of the preceding embodiments directed to solar modules, wherein the thermosettable epoxy composition comprises one or more epoxy resins each comprising di(glycidyl ether) of bisphenol A.

G. The solar module according to any of the preceding embodiments directed to solar modules, wherein the acrylic ester in the acrylic composition is chosen from monofunctional acrylic and methacrylic esters of nontertiary alkyl alcohols having from 2 to 20 carbon atoms.

H. The solar module according to any of the preceding embodiments directed to solar modules, wherein the acrylic ester in the acrylic composition is chosen from monofunctional acrylic and methacrylic esters of non-tertiary alkyl alcohols having from 4 to 20 carbon atoms.

I. The solar module according to any of the preceding embodiments directed to solar modules, wherein the acrylic ester in the acrylic composition is chosen from n-butyl acrylate, hexyl acrylate, 2-ethylhexyl acrylate, octyl acrylate, dodecyl acrylate, lauryl acrylate, octadecyl acrylate, and mixtures thereof.

J. The solar module according to any of the preceding embodiments directed to solar modules, wherein the polymerizable monomer in the acrylic composition is chosen from isobornyl acrylate, N-vinyl pyrrolidone, N-vinyl caprolactam, N-vinyl piperidine, N,N-dimethyl-acrylamide, acrylonitrile, and mixtures thereof.

K. The solar module according to any of the preceding embodiments directed to solar modules, wherein the acrylic composition comprises butyl acrylate and N-vinyl caprolactam.

L. The solar module according to any of the preceding embodiments directed to solar modules, wherein the acrylic composition further comprises an acrylate cross-linking agent.

M. The solar module according to any of the preceding embodiments directed to solar modules, wherein the acrylic composition further comprises an acrylate cross-linking agent chosen from divinyl ethers and multi-functional acrylates.

N. The solar module according to any of the preceding embodiments directed to solar modules, wherein the acrylic composition further comprises an acrylate cross-linking agent chosen from 1,6-hexanediol diacrylate, trimethylol-propane triacrylate, pentaerythritol tetraacrylate, 1,2-ethylene glycol diacrylate, 2-hydroxy-3-phenoxy propyl acrylate, and mixtures thereof.

O. The solar module according to any of the preceding embodiments directed to solar modules, wherein the intermediate bonding composition further comprises one or more photoinitiators.

P. The solar module according to any of the preceding embodiments directed to solar modules, wherein the intermediate bonding composition further comprises benzyl dimethyl ketal.

Q. The solar module according to any of the preceding embodiments directed to solar modules, wherein the intermediate bonding composition further comprises one or more adhesion promoters.

R. The solar module according to any of the preceding embodiments directed to solar modules, wherein the intermediate bonding composition further comprises one or more adhesion promoters chosen from organofunctional silanes.

S. The solar module according to any of the preceding embodiments directed to solar modules, wherein the intermediate bonding composition further comprises one or more additives chosen from hardeners, pigments, curative agents, curing accelerators, and fillers.

T. The solar module according to any of the preceding embodiments directed to solar modules, wherein the structural bonding composition further comprises one or more support materials.

U. The solar module according to any of the preceding embodiments directed to solar modules, wherein the structural bonding composition further comprises one or more support materials chosen from glass beads, glass bubbles, fibers, wires, non-woven scrims, and meshes.

V. The solar module according to any of the preceding embodiments directed to solar modules, wherein the structural bonding composition has a thickness from 0.1 mm to 4 mm.

W. The solar module according to any of the preceding embodiments directed to solar modules, wherein the structural bonding composition has a thickness from 0.2 mm to 2 mm.

X. The solar module according to any of the preceding embodiments directed to solar modules, wherein the structural bonding composition has a thickness from 0.3 mm to 1 mm.

Y. The solar module according to any of the preceding embodiments directed to solar modules, wherein the assembly shows bowing after 7 days in the glass panel bowing test from 0 mm to 2.5 mm.

Z. The solar module according to any of the preceding embodiments directed to solar modules, wherein the assembly shows bowing after 7 days in the glass panel bowing test from 0 mm to 2.0 mm.

AA. The solar module according to any of the preceding embodiments directed to solar modules, wherein the assembly shows bowing after 7 days in the glass panel bowing test from 0 mm to 1.5 mm.

BB. The solar module according to any of the preceding embodiments directed to solar modules, wherein the assembly shows bowing after 7 days in the glass panel bowing test from 0 mm to 1.0 mm.

CC. The solar module according to any of the preceding embodiments directed to solar modules, wherein the assembly shows bowing after 7 days in the glass panel bowing test from 0 mm to 0.5 mm.

DD. The solar module according to any of the preceding embodiments directed to solar modules, wherein the structural bonding composition has a stress at 100% strain in the overlap shear stress strain test from 0 $N/cm^2$ to 150$N/cm^2$.

EE. The solar module according to any of the preceding embodiments directed to solar modules, wherein the structural bonding composition has a stress at 100% strain in the overlap shear stress strain test from 0 $N/cm^2$ to 130$N/cm^2$.

FF. The solar module according to any of the preceding embodiments directed to solar modules, wherein the structural bonding composition has a stress at 100% strain in the overlap shear stress strain test from 0 $N/cm^2$ to 100$N/cm^2$.

GG. The solar module according to any of the preceding embodiments directed to solar modules, wherein the structural bonding composition has a stress at 100% strain in the overlap shear stress strain test from 0 $N/cm^2$ to 75$N/cm^2$.

HH. The solar module according to any of the preceding embodiments directed to solar modules, wherein the structural bonding composition has a stress at 100% strain in the overlap shear stress strain test from 0 $N/cm^2$ to 50$N/cm^2$.

II. The solar module according to any of the preceding embodiments directed to solar modules, wherein the structural bonding composition has a pluck adhesion in the pluck adhesion test from 35 $N/cm^2$ to 350 $N/cm^2$.

JJ. The solar module according to any of the preceding embodiments directed to solar modules, wherein the structural bonding composition has a pluck adhesion in the pluck adhesion test from 50 $N/cm^2$ to 350 $N/cm^2$.

KK. The solar module according to any of the preceding embodiments directed to solar modules, wherein the structural bonding composition has a pluck adhesion in the pluck adhesion test from 75 N/cm² to 350 N/cm².

LL. The solar module according to any of the preceding embodiments directed to solar modules, wherein the structural bonding composition has a pluck adhesion in the pluck adhesion test from 100N/cm² to 350 N/cm².

MM. The solar module according to any of the preceding embodiments directed to solar modules, wherein the structural bonding composition has a pluck adhesion in the pluck adhesion test from 110 N/cm² to 350 N/cm².

NN. The solar module according to any of the preceding embodiments directed to solar modules, wherein the structural bonding composition has a pluck adhesion in the pluck adhesion test from 140 N/cm² to 350 N/cm².

OO. The solar module according to any of the preceding embodiments directed to solar modules, wherein the structural bonding composition has a pluck adhesion in the pluck adhesion test from 150 N/cm² to 350 N/cm².

PP. The solar module according to any of the preceding embodiments directed to solar modules, wherein the structural bonding composition has a pluck adhesion in the pluck adhesion test from 200 N/cm² to 350 N/cm².

QQ. The solar module according to any of the preceding embodiments directed to solar modules, wherein the structural bonding composition has a pluck adhesion in the pluck adhesion test greater than 35 N/cm².

RR. The solar module according to any of the preceding embodiments directed to solar modules, wherein the structural bonding composition has a pluck adhesion in the pluck adhesion test greater than 50 N/cm².

SS. The solar module according to any of the preceding embodiments directed to solar modules, wherein the structural bonding composition has a pluck adhesion in the pluck adhesion test greater than 75 N/cm².

TT. The solar module according to any of the preceding embodiments directed to solar modules, wherein the structural bonding composition has a pluck adhesion in the pluck adhesion test greater than 100N/cm².

UU. The solar module according to any of the preceding embodiments directed to solar modules, wherein the structural bonding composition has a pluck adhesion in the pluck adhesion test greater than 110 N/cm².

VV. The solar module according to any of the preceding embodiments directed to solar modules, wherein the structural bonding composition has a pluck adhesion in the pluck adhesion test greater than 140 N/cm².

WW. The solar module according to any of the preceding embodiments directed to solar modules, wherein the structural bonding composition has a pluck adhesion in the pluck adhesion test greater than 150 N/cm².

XX. The solar module according to any of the preceding embodiments directed to solar modules, wherein the structural bonding composition has a pluck adhesion in the pluck adhesion test greater than 200 N/cm².

YY. The solar module according to any of the preceding embodiments directed to solar modules, wherein the structural bonding composition has a storage modulus at 25° C. from 0.5 MPa to 30 MPa.

ZZ. The solar module according to any of the preceding embodiments directed to solar modules, wherein the structural bonding composition has a storage modulus at 25° C. from 0.5 MPa to 25 MPa.

AAA. The solar module according to any of the preceding embodiments directed to solar modules, wherein the structural bonding composition has a storage modulus at 25° C. from 0.5 MPa to 20 MPa.

BBB. The solar module according to any of the preceding embodiments directed to solar modules, wherein the structural bonding composition has a storage modulus at 25° C. from 1 MPa to 15 MPa.

CCC. The solar module according to any of the preceding embodiments directed to solar modules, wherein the intermediate bonding composition comprises from 10% to 40% of the thermosettable epoxy composition by weight with respect to the total weight of the intermediate bonding composition.

DDD. The solar module according to any of the preceding embodiments directed to solar modules, wherein the intermediate bonding composition comprises from 15% to 35% of the thermosettable epoxy composition by weight with respect to the total weight of the intermediate bonding composition.

EEE. The solar module according to any of the preceding embodiments directed to solar modules, wherein the intermediate bonding composition comprises from 20% to 30% of the thermosettable epoxy composition by weight with respect to the total weight of the intermediate bonding composition.

Exemplary Methods of Affixing an Attachment Bracket to a Glazing Pane

A. A method of affixing an attachment bracket to a glazing pane comprising:
  providing a glazing pane and an attachment bracket,
  providing a structural bonding composition having a first major surface and a second major surface,
  forming an assembly by positioning the first major surface of the structural bonding composition in contact with the glazing pane and positioning the second major surface of the structural bonding composition in contact with the attachment bracket, and
  heating the assembly,
  wherein the structural bonding composition comprises an intermediate bonding composition, wherein the intermediate bonding composition comprises:
    a thermosettable epoxy composition comprising one or more epoxy resins, and
    an acrylic composition comprising the polymerization reaction product of a mixture comprising:
      an acrylic ester, and
      a polymerizable monomer.

B. The method according to any of the preceding embodiments directed to methods of affixing an attachment bracket to a glazing pane, wherein the intermediate bonding composition is a pressure sensitive adhesive.

C. The method according to any of the preceding embodiments directed to methods of affixing an attachment bracket to a glazing pane, wherein the thermosettable epoxy composition comprises one or more epoxy resins each comprising at least two epoxy groups per molecule.

D. The method according to any of the preceding embodiments directed to methods of affixing an attachment bracket to a glazing pane, wherein the thermosettable epoxy composition comprises one or more epoxy resins each chosen independently from phenolic epoxy resins, bisphenol epoxy resins, hydrogenated epoxy resins, aliphatic epoxy resins, halogenated bisphenol epoxy resins, novalac epoxy resins, and mixtures thereof.

E. The method according to any of the preceding embodiments directed to methods of affixing an attachment bracket to a glazing pane, wherein the thermosettable epoxy composition comprises one or more epoxy resins each chosen independently from bisphenol epoxy resins.
F. The method according to any of the preceding embodiments directed to methods of affixing an attachment bracket to a glazing pane, wherein the thermosettable epoxy composition comprises one or more epoxy resins each comprising di(glycidyl ether) of bisphenol A.
G. The method according to any of the preceding embodiments directed to methods of affixing an attachment bracket to a glazing pane, wherein the acrylic ester in the acrylic composition is chosen from monofunctional acrylic and methacrylic esters of non-tertiary alkyl alcohols having from 2 to 20 carbon atoms.
H. The method according to any of the preceding embodiments directed to methods of affixing an attachment bracket to a glazing pane, wherein the acrylic ester in the acrylic composition is chosen from monofunctional acrylic and methacrylic esters of non-tertiary alkyl alcohols having from 4 to 20 carbon atoms.
I. The method according to any of the preceding embodiments directed to methods of affixing an attachment bracket to a glazing pane, wherein the acrylic ester in the acrylic composition is chosen from n-butyl acrylate, hexyl acrylate, 2-ethylhexyl acrylate, octyl acrylate, dodecyl acrylate, lauryl acrylate, octadecyl acrylate, and mixtures thereof.
J. The method according to any of the preceding embodiments directed to methods of affixing an attachment bracket to a glazing pane, wherein the polymerizable monomer in the acrylic composition is chosen from isobornyl acrylate, N-vinyl pyrrolidone, N-vinyl caprolactam, N-vinyl piperidine, N,N-dimethylacrylamide, acrylonitrile, and mixtures thereof.
K. The method according to any of the preceding embodiments directed to methods of affixing an attachment bracket to a glazing pane, wherein the acrylic composition comprises butyl acrylate and N-vinyl caprolactam.
L. The method according to any of the preceding embodiments directed to methods of affixing an attachment bracket to a glazing pane, wherein the acrylic composition further comprises an acrylate crosslinking agent.
M. The method according to any of the preceding embodiments directed to methods of affixing an attachment bracket to a glazing pane, wherein the acrylic composition further comprises an acrylate crosslinking agent chosen from divinyl ethers and multi-functional acrylates.
N. The method according to any of the preceding embodiments directed to methods of affixing an attachment bracket to a glazing pane, wherein the acrylic composition further comprises an acrylate crosslinking agent chosen from 1,6-hexanediol diacrylate, tri-methylol-propane triacrylate, pentaerythritol tetraacrylate, 1,2-ethylene glycol diacrylate, 2-hydroxy-3-phenoxy propyl acrylate, and mixtures thereof.
O. The method according to any of the preceding embodiments directed to methods of affixing an attachment bracket to a glazing pane, wherein the intermediate bonding composition further comprises one or more photoinitiators.
P. The method according to any of the preceding embodiments directed to methods of affixing an attachment bracket to a glazing pane, wherein the intermediate bonding composition further comprises benzyl dimethyl ketal.
Q. The method according to any of the preceding embodiments directed to methods of affixing an attachment bracket to a glazing pane, wherein the intermediate bonding composition further comprises one or more adhesion promoters.
R. The method according to any of the preceding embodiments directed to methods of affixing an attachment bracket to a glazing pane, wherein the intermediate bonding composition further comprises one or more adhesion promoters chosen from organofunctional silanes.
S. The method according to any of the preceding embodiments directed to methods of affixing an attachment bracket to a glazing pane, wherein the intermediate bonding composition further comprises one or more additives chosen from hardeners, pigments, curative agents, curing accelerators, and fillers.
T. The method according to any of the preceding embodiments directed to methods of affixing an attachment bracket to a glazing pane, wherein the structural bonding composition further comprises one or more support materials.
U. The method according to any of the preceding embodiments directed to methods of affixing an attachment bracket to a glazing pane, wherein the structural bonding composition further comprises one or more support materials chosen from glass beads, glass bubbles, fibers, wires, non-woven scrims, and meshes.
V. The method according to any of the preceding embodiments directed to methods of affixing an attachment bracket to a glazing pane, wherein the structural bonding composition has a thickness from 0.1 mm to 4 mm.
W. The method according to any of the preceding embodiments directed to methods of affixing an attachment bracket to a glazing pane, wherein the structural bonding composition has a thickness from 0.2 mm to 2 mm.
X. The method according to any of the preceding embodiments directed to methods of affixing an attachment bracket to a glazing pane, wherein the structural bonding composition has a thickness from 0.3 mm to 1 mm.
Y. The method according to any of the preceding embodiments directed to methods of affixing an attachment bracket to a glazing pane, wherein the assembly shows bowing after 7 days in the glass panel bowing test from 0 mm to 2.5 mm.
Z. The method according to any of the preceding embodiments directed to methods of affixing an attachment bracket to a glazing pane, wherein the assembly shows bowing after 7 days in the glass panel bowing test from 0 mm to 2.0 mm.
AA. The method according to any of the preceding embodiments directed to methods of affixing an attachment bracket to a glazing pane, wherein the assembly shows bowing after 7 days in the glass panel bowing test from 0 mm to 1.5 mm.
BB. The method according to any of the preceding embodiments directed to methods of affixing an attachment bracket to a glazing pane, wherein the assembly shows bowing after 7 days in the glass panel bowing test from 0 mm to 1.0 mm.
CC. The method according to any of the preceding embodiments directed to methods of affixing an attachment bracket to a glazing pane, wherein the assembly shows bowing after 7 days in the glass panel bowing test from 0 mm to 0.5 mm.
DD. The method according to any of the preceding embodiments directed to methods of affixing an attachment bracket to a glazing pane, wherein the structural bonding composition has a stress at 100% strain in the overlap shear stress strain test from 0 N/cm$^2$ to 150N/cm$^2$.

EE. The method according to any of the preceding embodiments directed to methods of affixing an attachment bracket to a glazing pane, wherein the structural bonding composition has a stress at 100% strain in the overlap shear stress strain test from 0 N/cm² to 130N/cm².

FF. The method according to any of the preceding embodiments directed to methods of affixing an attachment bracket to a glazing pane, wherein the structural bonding composition has a stress at 100% strain in the overlap shear stress strain test from 0 N/cm² to 100N/cm².

GG. The method according to any of the preceding embodiments directed to methods of affixing an attachment bracket to a glazing pane, wherein the structural bonding composition has a stress at 100% strain in the overlap shear stress strain test from 0 N/cm² to 75N/cm².

HH. The method according to any of the preceding embodiments directed to methods of affixing an attachment bracket to a glazing pane, wherein the structural bonding composition has a stress at 100% strain in the overlap shear stress strain test from 0 N/cm² to 50N/cm².

II. The method according to any of the preceding embodiments directed to methods of affixing an attachment bracket to a glazing pane, wherein the structural bonding composition has a pluck adhesion in the pluck adhesion test from 35 N/cm² to 350 N/cm².

JJ. The method according to any of the preceding embodiments directed to methods of affixing an attachment bracket to a glazing pane, wherein the structural bonding composition has a pluck adhesion in the pluck adhesion test from 50 N/cm² to 350 N/cm².

KK. The method according to any of the preceding embodiments directed to methods of affixing an attachment bracket to a glazing pane, wherein the structural bonding composition has a pluck adhesion in the pluck adhesion test from 75 N/cm² to 350 N/cm².

LL. The method according to any of the preceding embodiments directed to methods of affixing an attachment bracket to a glazing pane, wherein the structural bonding composition has a pluck adhesion in the pluck adhesion test from 100N/cm² to 350 N/cm².

MM. The method according to any of the preceding embodiments directed to methods of affixing an attachment bracket to a glazing pane, wherein the structural bonding composition has a pluck adhesion in the pluck adhesion test from 110 N/cm² to 350 N/cm².

NN. The method according to any of the preceding embodiments directed to methods of affixing an attachment bracket to a glazing pane, wherein the structural bonding composition has a pluck adhesion in the pluck adhesion test from 140 N/cm² to 350 N/cm².

OO. The method according to any of the preceding embodiments directed to methods of affixing an attachment bracket to a glazing pane, wherein the structural bonding composition has a pluck adhesion in the pluck adhesion test from 150 N/cm² to 350 N/cm².

PP. The method according to any of the preceding embodiments directed to methods of affixing an attachment bracket to a glazing pane, wherein the structural bonding composition has a pluck adhesion in the pluck adhesion test from 200 N/cm² to 350 N/cm².

QQ. The method according to any of the preceding embodiments directed to methods of affixing an attachment bracket to a glazing pane, wherein the structural bonding composition has a pluck adhesion in the pluck adhesion test greater than 35 N/cm².

RR. The method according to any of the preceding embodiments directed to methods of affixing an attachment bracket to a glazing pane, wherein the structural bonding composition has a pluck adhesion in the pluck adhesion test greater than 50 N/cm².

SS. The method according to any of the preceding embodiments directed to methods of affixing an attachment bracket to a glazing pane, wherein the structural bonding composition has a pluck adhesion in the pluck adhesion test greater than 75 N/cm².

TT. The method according to any of the preceding embodiments directed to methods of affixing an attachment bracket to a glazing pane, wherein the structural bonding composition has a pluck adhesion in the pluck adhesion test greater than 100N/cm².

UU. The method according to any of the preceding embodiments directed to methods of affixing an attachment bracket to a glazing pane, wherein the structural bonding composition has a pluck adhesion in the pluck adhesion test greater than 110 N/cm².

VV. The method according to any of the preceding embodiments directed to methods of affixing an attachment bracket to a glazing pane, wherein the structural bonding composition has a pluck adhesion in the pluck adhesion test greater than 140 N/cm².

WW. The method according to any of the preceding embodiments directed to methods of affixing an attachment bracket to a glazing pane, wherein the structural bonding composition has a pluck adhesion in the pluck adhesion test greater than 150 N/cm².

XX. The method according to any of the preceding embodiments directed to methods of affixing an attachment bracket to a glazing pane, wherein the structural bonding composition has a pluck adhesion in the pluck adhesion test greater than 200 N/cm².

YY. The method according to any of the preceding embodiments directed to methods of affixing an attachment bracket to a glazing pane, wherein the structural bonding composition has a storage modulus at 25° C. from 0.5 MPa to 30 MPa.

ZZ. The method according to any of the preceding embodiments directed to methods of affixing an attachment bracket to a glazing pane, wherein the structural bonding composition has a storage modulus at 25° C. from 0.5 MPa to 25 MPa.

AAA. The method according to any of the preceding embodiments directed to methods of affixing an attachment bracket to a glazing pane, wherein the structural bonding composition has a storage modulus at 25° C. from 0.5 MPa to 20 MPa.

BBB. The method according to any of the preceding embodiments directed to methods of affixing an attachment bracket to a glazing pane, wherein the structural bonding composition has a storage modulus at 25° C. from 1 MPa to 15 MPa.

CCC. The method according to any of the preceding embodiments directed to methods of affixing an attachment bracket to a glazing pane, wherein the intermediate bonding composition comprises from 10% to 40% of the thermosettable epoxy composition by weight with respect to the total weight of the intermediate bonding composition.

DDD. The method according to any of the preceding embodiments directed to methods of affixing an attachment bracket to a glazing pane, wherein the intermediate bonding composition comprises from 15% to 35% of the thermosettable epoxy composition by weight with respect to the total weight of the intermediate bonding composition.

EEE. The method according to any of the preceding embodiments directed to methods of affixing an attachment bracket to a glazing pane, wherein the intermediate bonding composition comprises from 20% to 30% of the thermosettable epoxy composition by weight with respect to the total weight of the intermediate bonding composition.

Exemplary Methods of Affixing an Attachment Bracket to a Solar Module

A. A method of affixing an attachment bracket to a solar module comprising:
  providing a pre-lamination solar module comprising:
    one or more photovoltaic cells each comprising a first major surface and a second major surface,
    a glazing pane adjacent one of the major surfaces of the one or more photovoltaic cells,
  providing an attachment bracket,
  providing a thermosettable adhesive composition,
  forming a solar module assembly by positioning the thermosettable adhesive composition between the glazing pane of the pre-lamination solar module and the attachment bracket, and
  heating the solar module assembly, thereby forming a bond between the glazing pane and the attachment bracket via the thermosettable adhesive composition.

B. The method according to any of the preceding embodiments directed to methods of affixing an attachment bracket to a solar module, wherein the thermosettable adhesive composition comprises an intermediate bonding composition, wherein the intermediate bonding composition comprises:
  a thermosettable epoxy composition comprising one or more epoxy resins, and
  an acrylic composition comprising the polymerization reaction product of a mixture comprising:
    an acrylic ester, and
    a polymerizable monomer.

C. The method according to any of the preceding embodiments directed to methods of affixing an attachment bracket to a solar module, wherein the thermosettable adhesive composition is a structural bonding tape.

D. The method according to any of the preceding embodiments directed to methods of affixing an attachment bracket to a solar module, wherein the thermosettable adhesive composition is a pressure sensitive adhesive.

E. The method according to any of the preceding embodiments directed to methods of affixing an attachment bracket to a solar module using an intermediate bonding composition (such as e.g., Embodiment B and all of the embodiments that depend from Embodiment B), wherein the thermosettable epoxy composition comprises one or more epoxy resins each comprising at least two epoxy groups per molecule.

F. The method according to any of the preceding embodiments directed to methods of affixing an attachment bracket to a solar module using an intermediate bonding composition (such as e.g., Embodiment B and all of the embodiments that depend from Embodiment B), wherein the thermosettable epoxy composition comprises one or more epoxy resins each chosen independently from phenolic epoxy resins, bisphenol epoxy resins, hydrogenated epoxy resins, aliphatic epoxy resins, halogenated bisphenol epoxy resins, novalac epoxy resins, and mixtures thereof.

G. The method according to any of the preceding embodiments directed to methods of affixing an attachment bracket to a solar module using an intermediate bonding composition (such as e.g., Embodiment B and all of the embodiments that depend from Embodiment B), wherein the thermosettable epoxy composition comprises one or more epoxy resins each chosen independently from bisphenol epoxy resins.

H. The method according to any of the preceding embodiments directed to methods of affixing an attachment bracket to a solar module using an intermediate bonding composition (such as e.g., Embodiment B and all of the embodiments that depend from Embodiment B), wherein the thermosettable epoxy composition comprises one or more epoxy resins each comprising di(glycidyl ether) of bisphenol A.

I. The method according to any of the preceding embodiments directed to methods of affixing an attachment bracket to a solar module using an intermediate bonding composition (such as e.g., Embodiment B and all of the embodiments that depend from Embodiment B), wherein the acrylic ester in the acrylic composition is chosen from monofunctional acrylic and methacrylic esters of non-tertiary alkyl alcohols having from 2 to 20 carbon atoms.

J. The method according to any of the preceding embodiments directed to methods of affixing an attachment bracket to a solar module using an intermediate bonding composition (such as e.g., Embodiment B and all of the embodiments that depend from Embodiment B), wherein the acrylic ester in the acrylic composition is chosen from monofunctional acrylic and methacrylic esters of non-tertiary alkyl alcohols having from 4 to 20 carbon atoms.

K. The method according to any of the preceding embodiments directed to methods of affixing an attachment bracket to a solar module using an intermediate bonding composition (such as e.g., Embodiment B and all of the embodiments that depend from Embodiment B), wherein the acrylic ester in the acrylic composition is chosen from n-butyl acrylate, hexyl acrylate, 2-ethylhexyl acrylate, octyl acrylate, dodecyl acrylate, lauryl acrylate, octadecyl acrylate, and mixtures thereof.

L. The method according to any of the preceding embodiments directed to methods of affixing an attachment bracket to a solar module using an intermediate bonding composition (such as e.g., Embodiment B and all of the embodiments that depend from Embodiment B), wherein the polymerizable monomer in the acrylic composition is chosen from isobornyl acrylate, N-vinyl pyrrolidone, N-vinyl caprolactam, N-vinyl piperidine, N,N-dimethylacrylamide, acrylonitrile, and mixtures thereof.

M. The method according to any of the preceding embodiments directed to methods of affixing an attachment bracket to a solar module using an intermediate bonding composition (such as e.g., Embodiment B and all of the embodiments that depend from Embodiment B), wherein the acrylic composition comprises butyl acrylate and N-vinyl caprolactam.

N. The method according to any of the preceding embodiments directed to methods of affixing an attachment bracket to a solar module using an intermediate bonding composition (such as e.g., Embodiment B and all of the embodiments that depend from Embodiment B), wherein the acrylic composition further comprises an acrylate crosslinking agent.

O. The method according to any of the preceding embodiments directed to methods of affixing an attachment bracket to a solar module using an intermediate bonding composition (such as e.g., Embodiment B and all of the embodiments that depend from Embodiment B), wherein the acrylic composition further comprises an acrylate crosslinking agent chosen from divinyl ethers and multifunctional acrylates.
P. The method according to any of the preceding embodiments directed to methods of affixing an attachment bracket to a solar module using an intermediate bonding composition (such as e.g., Embodiment B and all of the embodiments that depend from Embodiment B), wherein the acrylic composition further comprises an acrylate crosslinking agent chosen from 1,6-hexanediol diacrylate, tri-methylol-propane triacrylate, pentaerythritol tetraacrylate, 1,2-ethylene glycol diacrylate, 2-hydroxy-3-phenoxy propyl acrylate, and mixtures thereof.
Q. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition further comprises one or more photoinitiators.
R. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition further comprises benzyl dimethyl ketal.
S. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition further comprises one or more adhesion promoters.
T. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition further comprises one or more adhesion promoters chosen from organofunctional silanes.
U. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition further comprises one or more additives chosen from hardeners, pigments, curative agents, curing accelerators, and fillers.
V. The method according to any of the preceding embodiments directed to methods of affixing an attachment bracket to a solar module, wherein the thermosettable adhesive composition further comprises one or more support materials.
W. The method according to any of the preceding embodiments directed to methods of affixing an attachment bracket to a solar module, wherein the thermosettable adhesive composition further comprises one or more support materials chosen from glass beads, glass bubbles, fibers, wires, non-woven scrims, and meshes.
X. The method according to any of the preceding embodiments directed to methods of affixing an attachment bracket to a solar module, wherein the thermosettable adhesive composition is a structural bonding tape and the structural bonding tape has a thickness from 0.1 mm to 4 mm.
Y. The method according to any of the preceding embodiments directed to methods of affixing an attachment bracket to a solar module, wherein the thermosettable adhesive composition is a structural bonding tape and the structural bonding tape has a thickness from 0.2 mm to 2 mm.
Z. The method according to any of the preceding embodiments directed to methods of affixing an attachment bracket to a solar module, wherein the thermosettable adhesive composition is a structural bonding tape and the structural bonding tape has a thickness from 0.3 mm to 1 mm.
AA. The method according to any of the preceding embodiments directed to methods of affixing an attachment bracket to a solar module, wherein the solar module assembly shows bowing after 7 days in the glass panel bowing test from 0 mm to 2.5 mm.
BB. The method according to any of the preceding embodiments directed to methods of affixing an attachment bracket to a solar module, wherein solar module assembly shows bowing after 7 days in the glass panel bowing test from 0 mm to 2.0 mm.
CC. The method according to any of the preceding embodiments directed to methods of affixing an attachment bracket to a solar module, wherein the solar module assembly shows bowing after 7 days in the glass panel bowing test from 0 mm to 1.5 mm.
DD. The method according to any of the preceding embodiments directed to methods of affixing an attachment bracket to a solar module, wherein the solar module assembly shows bowing after 7 days in the glass panel bowing test from 0 mm to 1.0 mm.
EE. The method according to any of the preceding embodiments directed to methods of affixing an attachment bracket to a solar module, wherein the solar module assembly shows bowing after 7 days in the glass panel bowing test from 0 mm to 0.5 mm.
FF. The method according to any of the preceding embodiments directed to methods of affixing an attachment bracket to a solar module, wherein the thermosettable adhesive composition is a structural bonding tape and the structural bonding tape has a stress at 100% strain in the overlap shear stress strain test from 0 N/cm$^2$ to 150N/cm$^2$.
GG. The method according to any of the preceding embodiments directed to methods of affixing an attachment bracket to a solar module, wherein the thermosettable adhesive composition is a structural bonding tape and the structural bonding tape has a stress at 100% strain in the overlap shear stress strain test from 0 N/cm$^2$ to 130N/cm$^2$.
HH. The method according to any of the preceding embodiments directed to methods of affixing an attachment bracket to a solar module, wherein the thermosettable adhesive composition is a structural bonding tape and the structural bonding tape has a stress at 100% strain in the overlap shear stress strain test from 0 N/cm$^2$ to 100N/cm$^2$.
II. The method according to any of the preceding embodiments directed to methods of affixing an attachment bracket to a solar module, wherein the thermosettable adhesive composition is a structural bonding tape and the structural bonding tape has a stress at 100% strain in the overlap shear stress strain test from 0 N/cm$^2$ to 75N/cm$^2$.
JJ. The method according to any of the preceding embodiments directed to methods of affixing an attachment bracket to a solar module, wherein the thermosettable adhesive composition is a structural bonding tape and the structural bonding tape has a stress at 100% strain in the overlap shear stress strain test from 0 N/cm$^2$ to 50N/cm$^2$.

KK. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 35 N/cm² to 350 N/cm².

LL. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 50 N/cm² to 350 N/cm².

MM. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 75 N/cm² to 350 N/cm².

NN. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 100 N/cm² to 350 N/cm².

OO. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 110 N/cm² to 350 N/cm².

PP. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 140 N/cm² to 350 N/cm².

QQ. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 150 N/cm² to 350 N/cm².

RR. The method according to any of the preceding embodiments directed to methods of affixing an attachment bracket to a solar module, wherein the thermosettable adhesive composition is a structural bonding tape and the structural bonding tape has a pluck adhesion in the pluck adhesion test from 200 N/cm² to 350 N/cm².

SS. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 35 N/cm².

TT. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 50 N/cm².

UU. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 75 N/cm².

VV. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 100N/cm².

WW. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 110 N/cm².

XX. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 140 N/cm².

YY. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 150 N/cm².

ZZ. The method according to any of the preceding embodiments directed to methods of affixing an attachment bracket to a solar module, wherein the thermosettable adhesive composition is a structural bonding tape and the structural bonding tape has a pluck adhesion in the pluck adhesion test greater than 200 N/cm².

AAA. The method according to any of the preceding embodiments directed to methods of affixing an attachment bracket to a solar module, wherein the thermosettable adhesive composition is a structural bonding tape and the structural bonding tape has a storage modulus at 25° C. from 0.5 MPa to 30 MPa.

BBB. The method according to any of the preceding embodiments directed to methods of affixing an attachment bracket to a solar module, wherein the thermosettable adhesive composition is a structural bonding tape and the structural bonding tape has a storage modulus at 25° C. from 0.5 MPa to 25 MPa.

CCC. The method according to any of the preceding embodiments directed to methods of affixing an attachment bracket to a solar module, wherein the thermosettable adhesive composition is a structural bonding tape and the structural bonding tape has a storage modulus at 25° C. from 0.5 MPa to 20 MPa.

DDD. The method according to any of the preceding embodiments directed to methods of affixing an attachment bracket to a solar module, wherein the thermosettable adhesive composition is a structural bonding tape and the structural bonding tape has a storage modulus at 25° C. from 1 MPa to 15 MPa.

EEE. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition comprises from 10% to 40% of the thermosettable epoxy composition by weight with respect to the total weight of the intermediate bonding composition.

FFF. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition comprises from 15% to 35% of the thermosettable epoxy composition by weight with respect to the total weight of the intermediate bonding composition.

GGG. The method according to any of the preceding embodiments directed to methods of affixing an attachment bracket to a solar module using an intermediate bonding composition (such as e.g., Embodiment B and all of the embodiments that depend from Embodiment B), wherein the intermediate bonding composition comprises from 20% to 30% of the thermosettable epoxy composition by weight with respect to the total weight of the intermediate bonding composition.

HHH. The method according to any of the preceding embodiments directed to methods of affixing an attachment bracket to a solar module, wherein the heating step is part of the lamination of the solar module.

III. The method according to any of the preceding embodiments directed to methods of affixing an attachment bracket to a solar module, wherein the heating occurs at temperatures form 100° C. to 200° C.

JJJ. The method according to any of the preceding embodiments directed to methods of affixing an attachment bracket to a solar module, wherein the heating occurs from a period from 3 min to 120 min.

KKK. The method according to any of the preceding embodiments directed to methods of affixing an attachment bracket to a solar module, wherein the attachment bracket comprises:
a main body having a top surface and a bottom surface,
at least one solar module mounting portion on the top surface of the main body configured to receive a solar module on the attachment bracket,
at least one substructure mounting portion on the bottom surface of the main body configured to attach to a substructure,
wherein the main body of the attachment bracket has a height,
wherein the substructure mounting portion on the bottom surface of the main body has at least one bottom edge,
wherein the at least one bottom edge is rounded.

LLL. The method according to any of the preceding embodiments directed to methods of affixing an attachment bracket to a solar module, wherein the attachment bracket is any of the attachment brackets recited in the present disclosure, including the attachment brackets recited in any of the embodiments in the section titled "Exemplary Methods of Affixing an Attachment Bracket to a Solar Panel" below.

Exemplary Attachment Bracket Embodiments

A. An attachment bracket comprising:
a main body having a top surface and a bottom surface,
at least one solar module mounting portion on the top surface of the main body configured to receive a solar module on the attachment bracket,
at least one substructure mounting portion on the bottom surface of the main body configured to attach to a substructure,
wherein the main body of the attachment bracket has a height,
wherein the substructure mounting portion on the bottom surface of the main body has at least one bottom edge,
wherein the at least one bottom edge is rounded.

B. The attachment bracket according to any of the preceding embodiments directed to attachment brackets, wherein the at least one substructure mounting portion on the bottom surface of the main body has four sides,
wherein the bottom surface of the main body has a width and a length and has four bottom edges, one edge along each of the four sides,
wherein each of the two bottom edges along the length of the bottom surface defines a longitudinal bottom edge,
wherein each of the two bottom edges along the width of the bottom surface defines a lateral bottom edge,
wherein the two longitudinal bottom edges and the two lateral bottom edges are rounded,
wherein a bottom corner is formed wherever a longitudinal bottom edge meets a lateral bottom edge, and
wherein each bottom corner in the attachment bracket is rounded.

C. The attachment bracket according to any of the preceding embodiments directed to attachment brackets, wherein the height of the main body of the attachment bracket is 1 inch or less.

D. The attachment bracket according to any of the preceding embodiments directed to attachment brackets, wherein the height of the main body of the attachment bracket is ½ inch or less.

E. The attachment bracket according to any of the preceding embodiments directed to attachment brackets, wherein the height of the main body of the attachment bracket is ⅜ inch or less.

F. The attachment bracket according to any of the preceding embodiments directed to attachment brackets, wherein the height of the main body of the attachment bracket is ¼ inch or less.

G. The attachment bracket according to any of the preceding embodiments directed to attachment brackets, wherein the height of the main body of the attachment bracket is ⅛ inch or less.

H. The attachment bracket according to any of the preceding embodiments directed to attachment brackets, wherein the radius of each rounded bottom edge of the attachment bracket is 1/32 inch or more.

I. The attachment bracket according to any of the preceding embodiments directed to attachment brackets, wherein the radius of each rounded bottom edge of the attachment bracket is 1/16 inch or more.

J. The attachment bracket according to any of the preceding embodiments directed to attachment brackets, wherein the radius of each rounded bottom edge of the attachment bracket is ⅛ inch or more.

K. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is 1/32 inch or more.

L. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is 1/16 inch or more.

M. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is ⅛ inch or more.

N. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded bottom corner of the attachment bracket is ¹⁄₃₂ inch or more.

O. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded bottom corner of the attachment bracket is ¹⁄₁₆ inch or more.

P. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein the radius of each rounded bottom corner of the attachment bracket is ⅛ inch or more.

Q. The attachment bracket according to any of the preceding embodiments directed to attachment brackets, wherein when the height of the main body of the attachment bracket is from ⅜ inch to ½ inch, the radius of the at least one rounded bottom edge of the attachment bracket is from ¹⁄₁₆ inch to ⅛ inch.

R. The attachment bracket according to any of the preceding embodiments directed to attachment brackets, wherein when the height of the main body of the attachment bracket is from ¼ inch to ⅜ inch, the radius of the at least one rounded bottom edge of the attachment bracket is from ¹⁄₃₂ inch to ¹⁄₁₆ inch.

S. The attachment bracket according to any of the preceding embodiments directed to attachment brackets, wherein when the height of the main body of the attachment bracket is from ⅛ inch to ¼ inch, the radius of the at least one rounded bottom edge of the attachment bracket is from 0 inches to ¹⁄₃₂ inch.

T. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ⅜ inch to ½ inch, the radius of each rounded bottom edge of the attachment bracket is from ¹⁄₁₆ inch to ⅛ inch.

U. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ¼ inch to ⅜ inch, the radius of each rounded bottom edge of the attachment bracket is from ¹⁄₃₂ inch to ¹⁄₁₆ inch.

V. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ⅛ inch to ¼ inch, the radius of each rounded bottom edge of the attachment bracket is from 0 inches to ¹⁄₃₂ inch.

W. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ⅜ inch to ½ inch, the radius of each rounded bottom corner of the attachment bracket is from ¹⁄₁₆ inch to ⅛ inch.

X. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ¼ inch to ⅜ inch, the radius of each rounded bottom corner of the attachment bracket is from ¹⁄₃₂ inch to ¹⁄₁₆ inch.

Y. The attachment bracket according to any of the preceding embodiments directed to attachment brackets having a substructure mounting portion on the bottom surface of the main body with four sides (such as, e.g., Embodiment B and any of the other embodiments depending from Embodiment B), wherein when the height of the main body of the attachment bracket is from ⅛ inch to ¼ inch, the radius of each rounded bottom corner of the attachment bracket is from 0 inches to ¹⁄₃₂ inch.

Z. The attachment bracket according to any of the preceding embodiments directed to attachment brackets, wherein the radius of each rounded bottom edge is greater than R, wherein R (in millimeters) is defined by $(H-5)/3$, wherein H is the height of the main body of the attachment bracket in millimeters.

AA. The attachment bracket according to any of the preceding embodiments directed to attachment brackets, wherein the radius of each rounded bottom edge is greater than R, wherein R (in millimeters) is defined by $(H-4)/3$, wherein H is the height of the main body of the attachment bracket in millimeters.

BB. The attachment bracket according to any of the preceding embodiments directed to attachment brackets, wherein the radius of each rounded bottom edge is greater than R, wherein R (in millimeters) is defined by $(H-3.8)/3$, wherein H is the height of the main body of the attachment bracket in millimeters.

CC. The attachment bracket according to any of the preceding embodiments directed to attachment brackets, wherein the attachment bracket is made from a metal or alloy.

DD. The attachment bracket according to any of the preceding embodiments directed to attachment brackets, wherein the attachment bracket is made from a metal or alloy, and wherein the metal or alloy is chosen from galvanized steel and aluminum.

EE. The attachment bracket according to any of the preceding embodiments directed to attachment brackets, wherein the attachment bracket is made from a metal or alloy, and wherein the metal or alloy has a protective anti-corrosion surface treatment.

FF. The attachment bracket according to any of the preceding embodiments directed to attachment brackets, wherein the attachment bracket is made from a metal or alloy, and wherein the metal or alloy has a protective anti-corrosion surface treatment chosen from a galvanized coating and anodized coatings.

GG. The attachment bracket according to any of the preceding embodiments directed to attachment brackets, wherein the attachment bracket has a hat channel design.

HH. The attachment bracket according to any of the preceding embodiments directed to attachment brackets, wherein the attachment bracket is an H-block type of rail.

II. The attachment bracket according to any of the preceding embodiments directed to attachment brackets, wherein the top surface of the body of the attachment bracket has a pair of raised channels configured to be in contact with a glazing pane and to create a cavity configured to receive a thermosettable adhesive composition.

JJ. The attachment bracket according to any of the preceding embodiments directed to attachment brackets, wherein the top surface of the body of the attachment bracket has a pair of raised channels configured to be in contact with a glazing pane and to create a cavity configured to receive a thermosettable adhesive composition, wherein the raised channels are located along the length of the top surface of the body of the attachment bracket.

KK. The attachment bracket according to any of the preceding embodiments directed to attachment brackets, wherein the top surface of the body of the attachment bracket has a pair of raised channels configured to be in contact with a glazing pane and to create a cavity configured to receive a thermosettable adhesive composition, wherein the raised channels are located along the width of the top surface of the body of the attachment bracket.

Exemplary Methods of Affixing an Attachment Bracket to a Solar Panel

A. A method of affixing an attachment bracket to a solar panel comprising:
   providing a pre-lamination solar panel comprising:
      one or more photovoltaic cells, each comprising a first major surface and a second major surface,
      a glazing pane adjacent one of the major surfaces of the one or more photovoltaic cells,
   providing an attachment bracket,
   wherein the attachment bracket comprises:
      a main body having a top surface and a bottom surface,
      at least one solar panel mounting portion on the top surface of the main body configured to receive the glazing pane of the solar panel,
      at least one substructure mounting portion on the bottom surface of the main body configured to attach to a substructure,
   wherein the main body of the attachment bracket has a height,
   wherein the substructure mounting portion on the bottom surface of the main body has at least one bottom edge,
   wherein the at least one bottom edge is rounded,
   providing a thermosettable adhesive composition,
   forming a solar panel assembly by positioning the thermosettable adhesive composition between the glazing pane of the pre-lamination solar panel and the solar panel mounting portion on the top surface of the main body of the attachment bracket, and
   heating the solar panel assembly, thereby forming a bond between the glazing pane and the attachment bracket via the thermosettable adhesive composition.

B. The method according to any of the preceding embodiments directed to methods of affixing an attachment bracket to a solar panel, wherein the at least one substructure mounting portion on the bottom surface of the main body has four sides, wherein the bottom surface of the main body has a width and a length and has four bottom edges, one edge along each of the four sides,
   wherein each of the two bottom edges along the length of the bottom surface defines a longitudinal bottom edge,
   wherein each of the two bottom edges along the width of the bottom surface defines a lateral bottom edge,
   wherein the two longitudinal bottom edges and the two lateral bottom edges are rounded,
   wherein a bottom corner is formed wherever a longitudinal bottom edge meets a lateral bottom edge, and
   wherein each bottom corner in the attachment bracket is rounded.

C. The method according to any of the preceding embodiments directed to methods of affixing an attachment bracket to a solar panel, wherein the height of the main body of the attachment bracket is 1 inch or less.

D. The method according to any of the preceding embodiments directed to methods of affixing an attachment bracket to a solar panel, wherein the height of the main body of the attachment bracket is ½ inch or less.

E. The method according to any of the preceding embodiments directed to methods of affixing an attachment bracket to a solar panel, wherein the height of the main body of the attachment bracket is ⅜ inch or less.

F. The method according to any of the preceding embodiments directed to methods of affixing an attachment bracket to a solar panel, wherein the height of the main body of the attachment bracket is ¼ inch or less.

G. The method according to any of the preceding embodiments directed to methods of affixing an attachment bracket to a solar panel, wherein the height of the main body of the attachment bracket is ⅛ inch or less.

H. The method according to any of the preceding embodiments directed to methods of affixing an attachment bracket to a solar panel, wherein the radius of each rounded bottom edge of the attachment bracket is 1/32 inch or more.

I. The method according to any of the preceding embodiments directed to methods of affixing an attachment bracket to a solar panel, wherein the radius of each rounded bottom edge of the attachment bracket is 1/16 inch or more.

J. The method according to any of the preceding embodiments directed to methods of affixing an attachment bracket to a solar panel, wherein the radius of each rounded bottom edge of the attachment bracket is ⅛ inch or more.

K. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is 1/32 inch or more.

L. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is 1/16 inch or more.

M. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded lateral bottom edge and each rounded longitudinal bottom edge of the attachment bracket is 1/8 inch or more.

N. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded bottom corner of the attachment bracket is 1/32 inch or more.

O. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded bottom corner of the attachment bracket is 1/16 inch or more.

P. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein the radius of each rounded bottom corner of the attachment bracket is 1/8 inch or more.

Q. The method according to any of the preceding embodiments directed to methods of affixing an attachment bracket to a solar panel, wherein when the height of the main body of the attachment bracket is from 3/8 inch to 1/2 inch, the radius of the at least one rounded bottom edge of the attachment bracket is from 1/16 inch to 1/8 inch.

R. The method according to any of the preceding embodiments directed to methods of affixing an attachment bracket to a solar panel, wherein when the height of the main body of the attachment bracket is from 1/4 inch to 3/8 inch, the radius of the at least one rounded bottom edge of the attachment bracket is from 1/32 inch to 1/16 inch.

S. The method according to any of the preceding embodiments directed to methods of affixing an attachment bracket to a solar panel, wherein when the height of the main body of the attachment bracket is from 1/8 inch to 1/4 inch, the radius of the at least one rounded bottom edge of the attachment bracket is from 0 inches to 1/32 inch.

T. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 3/8 inch to 1/2 inch, the radius of each rounded bottom edge of the attachment bracket is from 1/16 inch to 1/8 inch.

U. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 1/4 inch to 3/8 inch, the radius of each rounded bottom edge of the attachment bracket is from 1/32 inch to 1/16 inch.

V. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 1/8 inch to 1/4 inch, the radius of each rounded bottom edge of the attachment bracket is from 0 inches to 1/32 inch.

W. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 3/8 inch to 1/2 inch, the radius of each rounded bottom corner of the attachment bracket is from 1/16 inch to 1/8 inch.

X. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 1/4 inch to 3/8 inch, the radius of each rounded bottom corner of the attachment bracket is from 1/32 inch to 1/16 inch.

Y. The method according to any of the preceding embodiments directed to methods of affixing an attachment bracket to a solar panel using an attachment bracket having a substructure mounting portion on the bottom surface of the main body with four sides (such as, e.g., Embodiment B and any of the other embodiments depending from Embodiment B), wherein when the height of the main body of the attachment bracket is from 1/8 inch to 1/4 inch, the radius of each rounded bottom corner of the attachment bracket is from 0 inches to 1/32 inch.

Z. The method according to any of the preceding embodiments directed to methods of affixing an attachment bracket to a solar panel, wherein the radius of each rounded bottom edge is greater than R, wherein R (in millimeters) is defined by (H−5)/3, wherein H is the height of the main body of the attachment bracket in millimeters.

AA. The method according to any of the preceding embodiments directed to methods of affixing an attachment bracket to a solar panel, wherein the radius of each rounded bottom edge is greater than R, wherein R (in millimeters) is defined by (H−4)/3, wherein H is the height of the main body of the attachment bracket in millimeters.

BB. The method according to any of the preceding embodiments directed to methods of affixing an attachment bracket to a solar panel, wherein the radius of each rounded bottom edge is greater than R, wherein R (in millimeters) is defined by (H−4.5)/3, wherein H is the height of the main body of the attachment bracket in millimeters.

CC. The method according to any of the preceding embodiments directed to methods of affixing an attachment bracket to a solar panel, wherein the radius of each rounded bottom edge is greater than R, wherein R (in millimeters) is defined by (H−3.8)/3, wherein H is the height of the main body of the attachment bracket in millimeters.

DD. The method according to any of the preceding embodiments directed to methods of affixing an attachment bracket to a solar panel, wherein the attachment bracket is made from a metal or alloy.

EE. The method according to any of the preceding embodiments directed to methods of affixing an attachment bracket to a solar panel, wherein the attachment bracket is made from a metal or alloy, and wherein the metal or alloy is chosen from galvanized steel and aluminum.

FF. The method according to any of the preceding embodiments directed to methods of affixing an attachment bracket to a solar panel, wherein the attachment bracket is made from a metal or alloy, and wherein the metal or alloy has a protective anti-corrosion surface treatment.

GG. The method according to any of the preceding embodiments directed to methods of affixing an attachment bracket to a solar panel, wherein the attachment bracket is made from a metal or alloy, and wherein the metal or alloy has a protective anti-corrosion surface treatment chosen from a galvanized coating and anodized coatings.

HH. The method according to any of the preceding embodiments directed to methods of affixing an attachment bracket to a solar panel, wherein the attachment bracket has a hat channel design.

II. The method according to any of the preceding embodiments directed to methods of affixing an attachment bracket to a solar panel, wherein the attachment bracket is an H-block type of rail.

JJ. The method according to any of the preceding embodiments directed to methods of affixing an attachment bracket to a solar panel, wherein the top surface of the body of the attachment bracket has a pair of raised channels configured to be in contact with a glazing pane and to create a cavity configured to receive a thermosettable adhesive composition.

KK. The method according to any of the preceding embodiments directed to methods of affixing an attachment bracket to a solar panel, wherein the top surface of the body of the attachment bracket has a pair of raised channels configured to be in contact with a glazing pane and to create a cavity configured to receive a thermosettable adhesive composition, wherein the raised channels are located along the length of the top surface of the body of the attachment bracket.

LL. The method according to any of the preceding embodiments directed to methods of affixing an attachment bracket to a solar panel, wherein the top surface of the body of the attachment bracket has a pair of raised channels configured to be in contact with a glazing pane and to create a cavity configured to receive a thermosettable adhesive composition, wherein the raised channels are located along the width of the top surface of the body of the attachment bracket.

MM. The method according to any of the preceding embodiments directed to methods of affixing an attachment bracket to a solar panel, wherein the thermosettable adhesive composition comprises an intermediate bonding composition, wherein the intermediate bonding composition comprises:
a thermosettable epoxy composition comprising one or more epoxy resins, and
an acrylic composition comprising the polymerization reaction product of a mixture comprising:
an acrylic ester, and
a polymerizable monomer.

NN. The method according to any of the preceding embodiments directed to methods of affixing an attachment bracket to a solar panel, wherein the thermosettable adhesive composition is any of the thermosettable adhesive compositions recited in the present disclosure, including the thermosettable adhesive compositions recited in any of the embodiments in the section titled "Exemplary Methods of Affixing an Attachment Bracket to a Solar Module" above.

OO. The method according to any of the preceding embodiments directed to methods of affixing an attachment bracket to a solar panel, wherein the heating step is part of the lamination of the solar module.

PP. The method according to any of the preceding embodiments directed to methods of affixing an attachment bracket to a solar panel, wherein the heating occurs at temperatures form 100° C. to 200° C.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Corporation, St. Louis, Mo., unless otherwise noted.

TABLE 1

Materials and sources.

| Material | Description or abbreviation | Source |
| --- | --- | --- |
| Butyl acrylate | BA | BASF, Florham Park, NJ |
| N-Vinyl caprolactam | NVC | BASF, Florham Park, NJ |
| 2-Hydroxy-3-phenoxy propyl acrylate | HPPA | Sigma Aldrich, St. Louis, MO |
| Hexanediol diacrylate | HDDA | Allnex USA, Inc., Smyrna, GA |

TABLE 1-continued

Materials and sources.

| Material | Description or abbreviation | Source |
| --- | --- | --- |
| Liquid epoxy resin comprised of di(glycidyl ether) of bisphenol A | EPON 828 | Momentive Specialty Chemicals, Inc., Columbus, OH |
| Solid epoxy resin comprised of di(glycidyl ether) of bisphenol A | EPON 1001F | Momentive Specialty Chemicals, Inc., Columbus, OH |
| Curative agent comprised of micronized dicyandiamide and silica | AMICURE CG-1200 | Air Products and Chemicals, Inc., Allentown, PA |
| 2,4-Diamino-6-[2-(2-methyl-1-imidazolyl)ethyl]-1,3,5-triazine | CUREZOL 2MZ-AZINE | Air Products and Chemicals, Inc., Allentown, PA |
| Benzil dimethyl ketal | IRGACURE 651 | BASF, Florham Park, NJ |
| Pentaerythritol tetrakis(3-(3,5-di-tert-butyl-4-hydroxyphenyl)propionate) | IRGANOX 1010 | BASF, Florham Park, NJ |
| Fumed silica | CAB-O-SIL M-5 | Cabot Corporation, Boston, MA |
| 3-(Glycidoxypropyl)trimethoxysilane | GPTMS | UCT, Inc., Bristol, PA |
| Pigment comprising 15% carbon black in an acrylic carrier | PENNCO 9B117 | Penn Color, Inc., Doylestown, PA |
| Release Liner | RSX951 | E. I. du Pont de Nemours and Company, Wilmington, DE |
| 1/8" × 3" × 18" float glass | Glass panels | |
| 1/8" × 1" × 18" aluminum stock | Aluminum panels | |
| .063" × 1" × 5", 5005 Alloy H34, temper mill finish undyed unsealed anodized aluminum | Anodized aluminum coupons | |
| 1" × 1/2" base, 1.5" × 1/2" top, 1/4" thick, 45 degree bevel, aluminum stock | Aluminum blocks | |
| 1/4" × 1" × 3" float glass | Glass slides | |
| Aircraft stainless steel lock wire, 0.025" diameter, item # 52-0105 | Stainless steel spacing wire | Malin Company, Cleveland, OH, |
| 3M Solar Acrylic Foam Tape 2204 | SAFT 2204 | 3M Company, St. Paul, MN |
| Dow PV-804 Neutral Sealant | PV804 | Dow Corning, Midland, MI |

Test Methods

Glass Panel Bowing

Specimens for the glass panel bowing test were prepared by bonding aluminum panels to glass panels with portions of structural bonding composition using lamination conditions similar to those used in the commercial production of photovoltaic modules. A 1/8"×3"×18" glass panel was cleaned with isopropyl alcohol (IPA) and acetone. A 1"×18" strip of the structural bonding composition was cut and pressed onto the glass along the center of the panel's length. The structural bonding composition was rolled with a hand roller to obtain good adhesive wet out. A 1/8"×1"×18" aluminum panel was cleaned with methyl ethyl ketone (MEK) and wiped several times until the cleaning cloth no longer removed visible residue. The cleaned side of the aluminum panel was pressed onto the structural bonding composition by hand and then the roller was applied to obtain good adhesive wet out.

Figure 6:
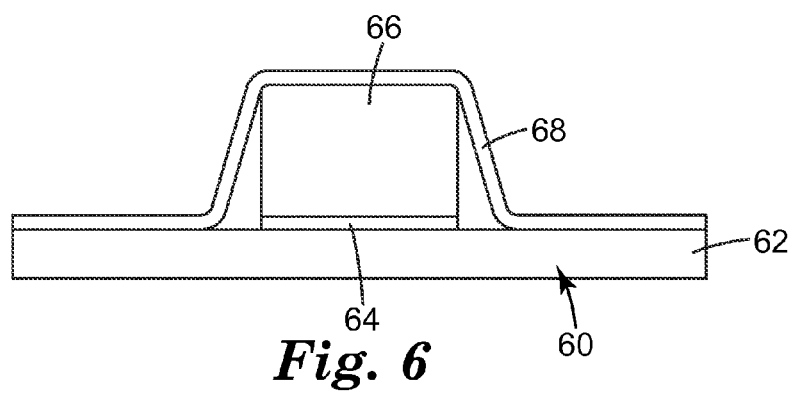
FIG. 6 presents a partial end view of an embodiment of the invention in contact with the bladder of a laminator.
Figure 7:
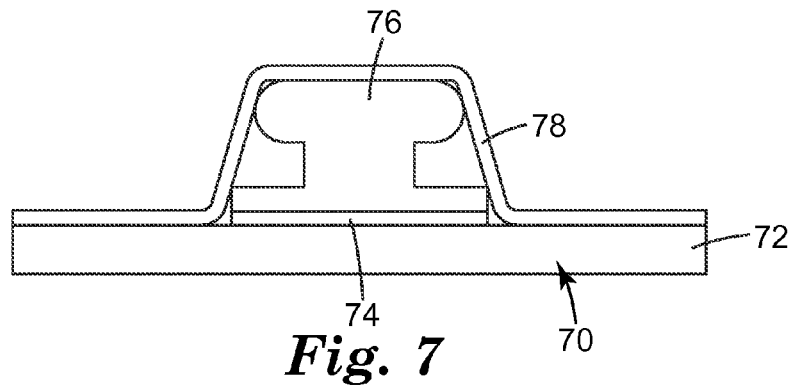
FIG. 7 presents a partial end view of an alternative embodiment of the invention in contact with the bladder of a laminator.
Figure 8:
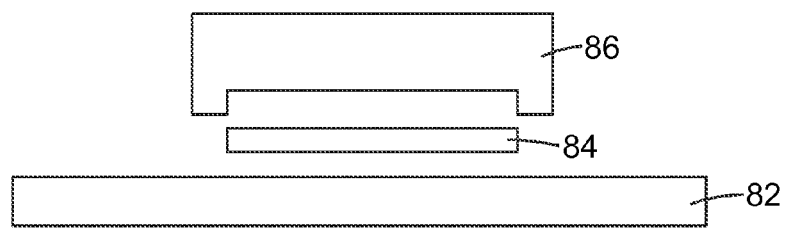
FIG. 8 presents an alternative embodiment of the invention.

The structural bonding composition was cured by exposing the assembled specimens to a vacuum lamination cycle that is typical of photovoltaic module manufacturing conditions, using a Photovoltaic Module Laminator, LM-50× 50-S (NPC Incorporated, Tokyo, Japan). FIGS. 6 and 7 provide schematic views of assembled specimens under a laminator bladder. The laminator temperature was 150° C., and the lamination cycle was 3 minutes at vacuum of about 7 kPa followed by 12 minutes at atmospheric pressure (~100 kPa). Cured specimens were removed from the laminator and allowed to cool prior to measurement of glass panel bowing. As illustrated in FIG. 10, specimens were placed on a flat laboratory bench 102 and bowing was measured by placing a 4 kg mass 106 on one end of the panel 104 and then using a ruler 108 to measure the distance 110 between the bottom of the glass panel and the table at the other end of the panel. The distance was measured using a 0.5 mm resolution metal ruler. Bowing of each specimen was measured twenty minutes after lamination and seven days after lamination.

Overlap Shear Stress-Strain Measurements

Overlap shear stress-strain measurements were obtained based on the method described in ASTM D1002. Samples were prepared using 0.063"×1"×5" anodized aluminum coupons. The bonding surface was cleaned with a 50% IPA/50% water mixture. The aluminum coupons were pressed against a 1" strip of structural bonding composition and then the composition was rolled with a hand roller to provide good adhesive wet out on the coupon. The edges of the structural bonding composition were trimmed to be flush with the edges of the metal coupon. A second aluminum coupon was pressed against the structural bonding composition to create an overlap shear sample with a 1"×1" bond area and a thickness which was that of the structural bonding composition.

The thickness of each sample was measured by first measuring the total thickness of the aluminum/structural bonding composition/aluminum laminate, and then subtracting the thicknesses of the two individual metal coupons. The difference is the thickness of the structural bonding composition between the two coupons.

The samples were cured in the laminator using a laminator temperature of 150° C., and the lamination cycle was 3 minutes at vacuum of about 7 kPa followed by 12 minutes at atmospheric pressure (~100 kPa). The upper coupon was placed on a shim to help maintain the bond line. Measurements were conducted in overlap-shear configuration using anodized aluminum panels and 25 mm×25 mm bonded area. Samples were loaded using a crosshead speed of 5 mm per minute. Structural bonding composition thickness was 0.6 mm unless otherwise indicated.

Pluck Adhesion

Figure 13:
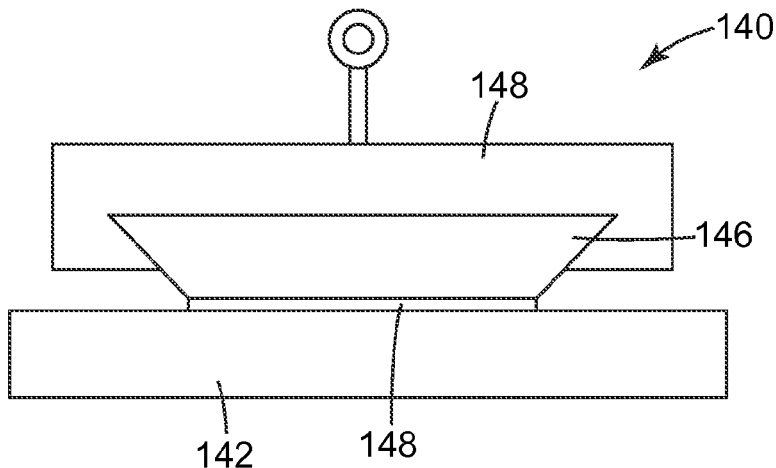
FIG. 13 is a schematic side view of a test specimen in a metal fixture for pluck adhesion testing.

As illustrated in FIG. 13, samples were prepared using 1×3"×1/4" glass slides 142. Aluminum blocks 146 were cut to have a 1"×1/2" base, 45 degree edges, and a 1"×1 1/2" top.

Structural bonding composition samples 144 were cut ½"×1" and attached to the center of the glass plate. Small lengths of stainless steel wire (not shown) were used as bond line spacers and placed on top of the structural bonding composition sample. The aluminum block 146 was then pressed into contact with the wire spacers and the structural bonding composition. The completed sample was then placed in the laminator and cured using a laminator temperature of 150° C., and the lamination cycle was 3 minutes at vacuum of about 7 kPa followed by 12 minutes at atmospheric pressure (~100 kPa). After the cycle was complete, the test specimen was removed from the laminator, allowed to cool to room temperature, and the aluminum block was placed in a metal fixture 148 to facilitate pluck testing. FIG. 13 presents an illustration of the cured test specimen after the aluminum block has been placed in the metal fixture. Measurements were conducted in pluck configuration and had a 12.5 mm×25 mm bonded area. Samples were loaded using a crosshead speed of 5 mm per minute. Structural bonding composition thickness was 0.6 mm unless otherwise indicated. The failure mode of the structural bonding composition in each test specimen is reported as cohesive failure (CF) or adhesive failure (AF) in Table 5.

Storage Modulus

Samples were tested in a Q800 DMA (dynamic mechanical analyzer) (TA Instruments Inc., New Castle, Del.) in Film-Tension mode. Samples were tested using a −35° C. five minute isothermal dwell followed by a −35° C. to 190° C. temperature ramp at a rate of 2° C. per minute. The oscillation amplitude was 15 microns, and the static force was 0.05 N.

Structural bonding composition samples were prepared by placing small pieces of the composition between two release liners, placing this assembly on a glass base to support the samples, and then exposing the samples to a vacuum lamination cycle using a laminator temperature of 150° C. The lamination cycle was 3 minutes at vacuum of about 7 kPa followed by 12 minutes at atmospheric pressure (~100 kPa). After cooling, the release liners were removed and 4 mm wide samples were cut from the cured structural bonding composition. Sample thickness and width were measured with a digital caliper at several points along the sample and an average was used for each property. Samples were then loaded into the Q800 DMA and analyzed. The storage modulus versus temperature was measured using a 2° C. per minute ramp from −35 to 190° C. The storage modulus was measured at 25° C. and 90° C. from the output data file.

DSC Measurements

Differential scanning calorimetry (DSC) was used to measure the curing exotherm of structural bonding compositions before and after exposure to a simulated lamination cycle (150° C. for fifteen minutes) in the DSC as described below. DSC experiments were performed using a Q2000 DSC (TA Instruments Inc., New Castle, Del.). Typical experiments involved sealing 6-20 milligrams of each composition in an aluminum, T-zero sample pan and exposing the sample to the conditions described below. In each experiment, a plot of heat flow versus temperature was used for the analysis and the exotherm energy (ΔH) is reported in J/g.

Measurements presented as "ΔH, initial" in Table 7 were conducted by recording the heat flow upon heating a sample from 30° C.-300° C. at 20° C. per minute.

Measurements presented as "ΔH, after 15 minutes isothermal @ 150° C." in Table 7 were conducted by first step heating a sample from 30° C.-150° C., then maintaining the sample temperature at 150° C. for fifteen minutes, then step cooling the sample from 150° C.-30° C., then recording the heat flow upon heating the sample from 30° C.-300° C. at 20° C. per minute.

Compounding

Structural bonding compositions of the present invention were prepared by premixing and photopolymerizing photopolymerizable monomers and a photoinitiator according to U.S. Pat. No. 5,086,088, which is hereby incorporated in its entirety. This premix was partially polymerized using an ultraviolet light source to a viscosity in the range of from about 150 cps to about 5,000 cps. The premix was then combined with the other compounds in each formulation prior to final photopolymerization.

Structural bonding compositions 1-10 are provided in Table 2 and were prepared according to the following method. A 3:1 (w:w) mixture of n-butyl acrylate (BA) and N-vinyl caprolactam (NVC) was blended with 0.04 parts of IRGACURE 651 per 100 parts of the BA:NVC monomer mixture. The resulting blend was degassed and photopolymerized under a nitrogen atmosphere using an ultraviolet light source to a viscosity of about 200 cps and the resulting premix was designated as Mixture A.

A 9:5 (w:w) mixture of EPON 828 and EPON 1001F was prepared by adding 248 grams of EPON 828 and 133 grams of EPON 1001F to a glass jar. The resulting slurry was stirred with heating, by means of a hot-plate, until the mixture became homogenous. The resulting mixture was allowed to cool to ambient temperature and was designated as Mixture B.

Portions of Mixture A and Mixture B were combined in a metal can in the amounts reported in Table 2. The HPPA, HDDA, CAB-O-SIL M-5, GPTMS, and PENNCO 9B117 were added according to Table 2 and the resulting mixture was stirred using a wooden tongue depressor until uniform. The AMICURE CG1200, CUREZOL 2MZ-AZINE, IRGACURE 651, and IRGANOX 1010 were added and the resulting mixture was stirred using a lab mixer (Netzsch Premier Technologies, Exton Pa., model 2005 equipped with a high-viscosity mixing blade) for five to ten minutes.

Each mixture was then degassed and coated to a thickness of approximately 0.63 millimeters between two RSX951 release liners to form a coated composite. The coated composites were then irradiated according to conditions described in U.S. Pat. No. 6,348,118, which is hereby incorporated in its entirety. The coated composites were irradiated on both the top and bottom of each composite with ultraviolet lamps which had 90% of the emissions between 300 and 400 nanometers (nm), and a peak emission at 351 nm as measured with a UVIRAD radiometer (Model No. 30 VR365CH3) obtained from E.I.T. (Electronic Instrumentation & Technology, Inc.). The intensity was about 2 milliwatts/square centimeter (mW/sq cm), and the energy above and below each coated composite was 350 millijoules/square centimeter (mJ/sq cm), and the total energy was 700 mJ/sq cm.

TABLE 2

Structural bonding compositions.

| COMPOSITION (wt %) | 1 | 2 | 3 | 4 | 5 | 6 | 7 | 8 | 9 | 10 |
|---|---|---|---|---|---|---|---|---|---|---|
| Mixture A | 42.6 | 51.1 | 57.5 | 63.9 | 74.5 | 42.6 | 51.6 | 58.4 | 65.4 | 77.2 |
| Mixture B | 45.8 | 36.6 | 29.8 | 22.9 | 11.4 | 45.8 | 37.1 | 30.3 | 23.5 | 11.9 |
| HPPA | 3.2 | 3.8 | 4.3 | 4.8 | 5.6 | 3.2 | 3.9 | 4.4 | 4.9 | 5.8 |
| HDDA | 0.02 | 0.02 | 0.03 | 0.03 | 0.03 | 0.02 | 0.02 | 0.03 | 0.03 | 0.04 |
| CAB-O-SIL M-5 | 2.6 | 2.6 | 2.6 | 2.6 | 2.6 | 2.6 | 2.6 | 2.6 | 2.6 | 2.7 |
| GPTMS | 0.5 | 0.5 | 0.5 | 0.5 | 0.5 | 0.5 | 0.6 | 0.6 | 0.6 | 0.6 |
| PENNCO 9B117 | 0.4 | 0.4 | 0.4 | 0.4 | 0.4 | 0.4 | 0.4 | 0.4 | 0.4 | 0.4 |
| AMICURE CG-1200 | 3.6 | 3.6 | 3.6 | 3.6 | 3.6 | 3.6 | 2.9 | 2.4 | 1.8 | 0.9 |
| CUREZOL 2MZ-AZINE | 1.2 | 1.2 | 1.2 | 1.2 | 1.2 | 1.2 | 0.9 | 0.8 | 0.6 | 0.3 |
| IRGACURE 651 | 0.07 | 0.09 | 0.10 | 0.11 | 0.13 | 0.07 | 0.09 | 0.10 | 0.11 | 0.13 |
| IRGANOX 1010 | 0.05 | 0.05 | 0.05 | 0.05 | 0.05 | 0.05 | 0.05 | 0.05 | 0.05 | 0.05 |

Coated sheets were then tested according to the above described test methods and test results are presented in Tables 3-7. In these Tables, the sample numbers correspond to test specimens made using the structural bonding compositions as numbered in Table 2.

TABLE 3

Results of glass panel bowing measurements of laminates comprising structural bonding compositions.

| Sample | Description | Bowing After 20 Minutes (mm) | Bowing After 7 Days (mm) |
|---|---|---|---|
| 1 | 46 wt % epoxy, 3.6 wt % CG-1200 | 10.0 | 6 |
| 2 | 37 wt % epoxy, 3.6 wt % CG-1200 | 5.0 | 1.5 |
| 3 | 30 wt % epoxy, 3.6 wt % CG-1200 | 1.5 | 0.5 |
| 4 | 23 wt % epoxy, 3.6 wt % CG-1200 | 0.5 | 0 |
| 5 | 11 wt % epoxy, 3.6 wt % CG-1200 | 0.5 | 0 |
| 6 | 46 wt % epoxy | 10.0 | 6 |
| 7 | 37 wt % epoxy | 3.0 | 0.5 |
| 8 | 30 wt % epoxy | 2.0 | 0 |
| 9 | 24 wt % epoxy | 0.5 | 0 |
| 10 | 12 wt % epoxy | 0.5 | 0 |

TABLE 4

Stress-strain measurements conducted on lap-shear test specimens comprising structural bonding compositions.

| Sample | Stress At 100% Strain (N/cm$^2$) | Stress At 200% Strain (N/cm$^2$) |
|---|---|---|
| 1 | 132 | 326 |
| 2 | 139 | 355 |
| 3 | 63 | 187 |
| 4 | 14 | 29 |
| 5 | 16 | 37 |
| 6 | 78 | 285 |
| 7 | 73 | 196 |
| 8 | 41 | 117 |
| 9 | 12 | 28 |
| 10 | 11 | 18 |
| SAFT 2204 | 13 | 21 |
| PV804* | 21 | 43 |

*Adhesive thickness was 2 mm and samples were loaded using a crosshead speed of 5 mm per minute.

The glass panel bowing test was performed as described in the Test Methods section. The bowing was measured 20 minutes and 7 days after removal from the laminator. Panel bowing appears to be greater when measured 20 minutes after removal from the laminator as compared to bowing when measured 7 days after removal from the laminator. Bowing measured 20 minutes after removal from the laminator is indicative of the extent to which a panel may bow or otherwise distort upon curing; bowing measured 7 days after removal from the laminator is indicative of the extent to which a panel may bow after the adhesive has relaxed or deformed or strained in response to stresses in the assembly. A useful structural bonding composition will minimize bowing at both the 20 minute and 7 day interval so as to minimize the likelihood of breaking a panel or leading to permanent panel distortion.

TABLE 5

Results of pluck adhesion testing of structural bonding compositions.

| Sample | Pluck Adhesion (N/cm$^2$) | Failure Mode |
|---|---|---|
| 1 | 140 | cf (cohesive failure) |
| 2 | 337 | cf |
| 3 | 220 | cf |
| 4 | 51 | cf |
| 5 | 81 | cf |
| 6 | 181 | cf |
| 7 | 239 | cf |
| 8 | 140 | cf |
| 9 | 72 | cf |
| 10 | 33 | af (adhesive failure) |
| SAFT 2204 | 39 | cf |
| PV804* | 109 | cf |

*Adhesive thickness was 2 mm and samples were loaded using a crosshead speed of 5 mm per minute.

TABLE 6

Storage modulus (E') of structural bonding compositions.

| Sample | E', 25° C. (MPa) | E', 90° C. (MPa) |
|---|---|---|
| 1 | 34 | 7 |
| 2 | 14 | 2 |
| 3 | 6 | 1 |
| 4 | 3 | 0.6 |
| 5 | 1 | 0.3 |
| 6 | 33 | 6 |
| 7 | 20 | 3 |
| 8 | 11 | 1 |
| 9 | 7 | 1 |
| 10 | 4 | 0.7 |

TABLE 7

DSC measurements of structural bonding compositions.

| Sample | ΔH, Initial (J/g) | ΔH, After 15 minutes isothermal at 150° C. (J/g) |
|---|---|---|
| 1 | 191.5 | — |
| 2 | 155.1 | — |

TABLE 7-continued

DSC measurements of structural bonding compositions.

| Sample | ΔH, Initial (J/g) | ΔH, After 15 minutes isothermal at 150° C. (J/g) |
|---|---|---|
| 3 | 130.4 | — |
| 4 | 97.6 | — |
| 5 | 47.1 | 1.5 |
| 6 | 196.9 | — |
| 7 | 154.6 | — |
| 8 | 120.5 | 2.6 |
| 9 | 89.7 | 12.8 |
| 10 | 32.0 | 27.7 |

The glass panel bowing test is a measure of the extent to which a panel and rail assembly bows upon curing the structural bonding composition applied between the rail and the panel during the heated vacuum lamination process. Bowing originates from the differential expansion between the glass of the panel and the metal of the rail upon heating. For example, at ambient temperatures, the panel, structural bonding composition, and rail have the same length. When the panel, structural bonding composition, and rail are heated to a temperature necessary for lamination and cure of the structural bonding composition, the rail expands to a greater extent than the panel because of its greater coefficient of thermal expansion relative to that of the panel. At the elevated temperature, where there is a difference in panel and rail length, the structural bonding composition cures, thus locking this difference in rail and panel length in place. The panel and rail return to their original lengths upon cooling, which results in stress in the assembly. This stress results in panel bowing. If stresses are too high, this can result in glass and panel breakage or failure of the adhesive joint. Compositions giving bowing test results less than or equal to 1.5 mm (when evaluated using the above described test specimen geometry) are useful for rail bonding applications. For example, compositions 2-5 and 7-10. Higher values lead to panel breakage or undesirable panel distortion.

The pluck adhesion test is a measure of how well the structural bonding composition bonds the metal of the rail to the glass of the panel during the heated vacuum lamination process. The test measures the maximum strength of the structural bonding composition at failure when loaded in a tensile mode. Useful materials will exhibit high pluck strengths because this will prevent failure in the adhesive joint when subjected to the stresses associated with panel bowing. In actual use, high pluck strength is advantageous because higher pluck strength is associated with improved environmental resistance, such as resistance to wind loads and improved tolerance of wind gusts. When bonding relatively polar substrates such as metal and glass, it is expected that improved pluck strengths can be obtained by increasing the amount of epoxy components in the structural bonding composition. Interestingly, it was observed that slightly decreasing the amount of epoxy components in certain compositions led to increased pluck strength with the additional benefit of reduced panel bowing. For example, compare compositions 2, 3 and 7 versus compositions 1 and 6. Structural bonding compositions giving pluck test results greater than 40 N/cm$^2$ have greater adhesion than pressure-sensitive adhesives. Compositions having pluck test results greater than 110 N/cm$^2$ have greater adhesion than moisture-cured silicones but have the added benefit of immediate handling strength and rapid cure.

The storage modulus at 25° C. was measured to assess the stiffness of the cured structural bonding composition. The storage modulus of the cured structural bonding composition was measured in tensile mode. Structural bonding compositions having a larger modulus will more effectively transfer stresses associated with panel bowing to the structural bonding composition bond line. Useful materials will exhibit a relatively low storage modulus at 25° C. but will be sufficiently high so as to prevent failure in the adhesive layer when the adhesive is subjected to stresses associated with panel bowing. Structural bonding compositions having a storage modulus less than 30 MPa and higher than 1 MPa have a storage modulus that is intermediate between lower storage modulus pressure-sensitive adhesives and moisture-cured silicones and typical higher storage modulus epoxy-acrylic-based autoclave-cured adhesives.

The stress at 100% strain is a measure of the stress in the cured structural bonding composition when the structural bonding composition is deformed to 100% strain. The cured structural bonding composition is loaded in an overlap shear configuration and brought to 100% strain and the stress is recorded. Useful materials will exhibit relatively low stress at 100% strain. Compositions having a stress at 100% strain less than 130 N/cm$^2$ and higher than 75 N/cm$^2$ have a stress at 100% strain that is intermediate between both pressure-sensitive adhesives and moisture-cured silicones at the low end and typical epoxy-acrylic-based autoclave-curable adhesives at the high end.

Differential scanning calorimetry (DSC) was used to measure the curing exotherm of structural bonding compositions before and after exposure to a simulated lamination cycle (150° C. for fifteen minutes). Compositions 1-4, and 6-7 gave no residual exotherm. Compositions 5 and 8-10 gave measurable residual exotherms, indicative of incomplete conversion of the epoxy ingredients upon exposure to the simulated lamination cycle. Incomplete conversion of the epoxy ingredients is undesirable because this indicates incomplete cure of the structural bonding composition during the lamination cycle.

Attachment Bracket Geometry Examples

TABLE 8

MATERIALS.

| | |
|---|---|
| GLASS PANELS for testing | ⅛" × 4" × 6" Float Glass |
| PTFE-Coated Fiberglass Fabric | 0.006", Standard sheeting, McMaster-Carr |
| Steel attachment brackets | 1" × 4" steel specimens were machined to various heights and corner/edge radii |
| Vacuum Laminator | NPC Group, Photovoltaic Module Laminator LM-50 × 50-S |

Test Methods

Sample attachment brackets were fabricated from steel by machining them to various dimensions, shown in Table 9 and illustrated in FIGS. 11 and 12.

To test the rail profile in a lamination cycle, an individual rail was placed on top of two sheets of ⅛" thick float glass and then the stack was covered with a 0.006" thick sheet of fiberglass fabric coated with polytetrafluoroethylene (PTFE). The sample was then subjected to a lamination cycle in the vacuum laminator. The laminator temperature was 150° C., and the lamination cycle was 3 minutes at vacuum of about 7 kPa followed by 12 minutes at atmospheric pressure (~100 kPa).

At the end of the lamination cycle, the sample was removed and the cover sheet was examined for damage. A qualitative rating scale was used to measure the damage to the cover sheet:
- --=both ends show tearing,
- -=only one end shows tearing
- +=no tearing observed in sheet.

Tearing of the PTFE-coated fiberglass cover sheet was judged to be unacceptable because it represents probable damage to the vacuum lamination bladder over the course of repeated lamination cycles. The cases where tearing of the coversheet was not observed were thought to be acceptable for this type of process.

Two types of attachment brackets were used. Thicker attachment brackets, 6.4 mm and greater, had a small channel machined out to simulate a typical rail design. The thinner attachment brackets, 3.2 mm thick, did not have this channel machined out because there was not a sufficient thickness to accommodate a gap. The profiles are shown in FIGS. 11 and 12. The dimensions of the attachment brackets are shown in Table 9.

TABLE 9

Dimensions for test attachment brackets

| Thickness (mm) | Width (mm) | Length (mm) | Gap Height (mm) | Gap Width (mm) | FIG. number | Radii of Top Edges (mm) | Radii of Corners (mm) |
|---|---|---|---|---|---|---|---|
| 12.7 | 25 | 100 | 3 | 6 | 11 | 1.6, 3.2 | Sharp, 1.6, 3.2 |
| 9.5 | 25 | 100 | 3 | 6 | 11 | 0.79, 1.6, 3.2 | Sharp, 0.79, 1.6, 3.2 |
| 6.4 | 25 | 100 | 3 | 6 | 11 | Sharp, 0.79, 1.6 | Sharp, 0.79, 1.6 |
| 3.2 | 25 | 100 | 0 | 0 | 12 | Sharp, 0.79, 1.6 | Sharp, 0.79, 1.6 |

The results are shown in Table 10. It can be seen that attachment brackets with lower heights can accommodate sharper edges. As the thickness of the attachment brackets increases, it becomes necessary to round the edges and corner to a larger degree to avoid cutting the PTFE cover sheet during the lamination pressure cycle. Table 10 shows the region in which damage to the coversheet does not occur. This region is acceptable for a rail profile in the laminator.

The side channels did not affect the results. The primary variables affecting coversheet tearing were thickness of the rail and the rounding of the edges and corners. Damage to the coversheet from the side channels of the test attachment brackets was not observed.

rail height and edge radius that result in damage to the PTFE coversheet, representing the potential for damage to the laminator bladder. The region below the line corresponds to combinations of rail height and edge radius that did not result in damage to the PTFE coversheet, and therefore is thought to be less hazardous to the laminator bladder.

The successful line shows that for the laminator used, the dimensions of the attachment bracket that did not tear the PTFE cover sheet. It represents attachment bracket combinations that were judged to be acceptable for use in a laminator for module fabrications that would not damage the vacuum bladder. The failure line shows attachment bracket combinations of height versus edge radius that caused tearing in the PTFE coversheet. Tearing of the coversheet is assumed to represent a combination that would cause damage to the bladder over time. Design combinations that fall below the successful line are assumed to be viable designs for a vacuum lamination process that uses structural bonding material to affix the attachment brackets during vacuum lamination. Combinations that are above the Failure line would likely not work for vacuum laminations without damage to the bladder.

TABLE 10

Results from lamination experiments with various rail profiles.

| Rail Height (mm) | Sharp Edge, Sharp Corner | 0.79 mm Radius Edge, 0.79 mm Round Corner | 1.6 mm Radius Edge, Sharp Corner | 1.6 mm Radius Edge, 1.6 mm Round Corner | 3.2 mm Radius Edge, 3.2 mm Round Corner |
|---|---|---|---|---|---|
| 12.7 |  |  | -- | - | + |
| 9.5 | -- | -- | -- | + |  |
| 6.4 | -- | + | + | + |  |
| 3.2 | + | + | + | + |  |

Table 10 shows that thinner attachment brackets can have sharper edges, but that large attachment brackets need increasingly rounded edges and corners to prevent tearing of the PTFE coversheet that represents damage to the vacuum laminator bladder.

Figure 14:
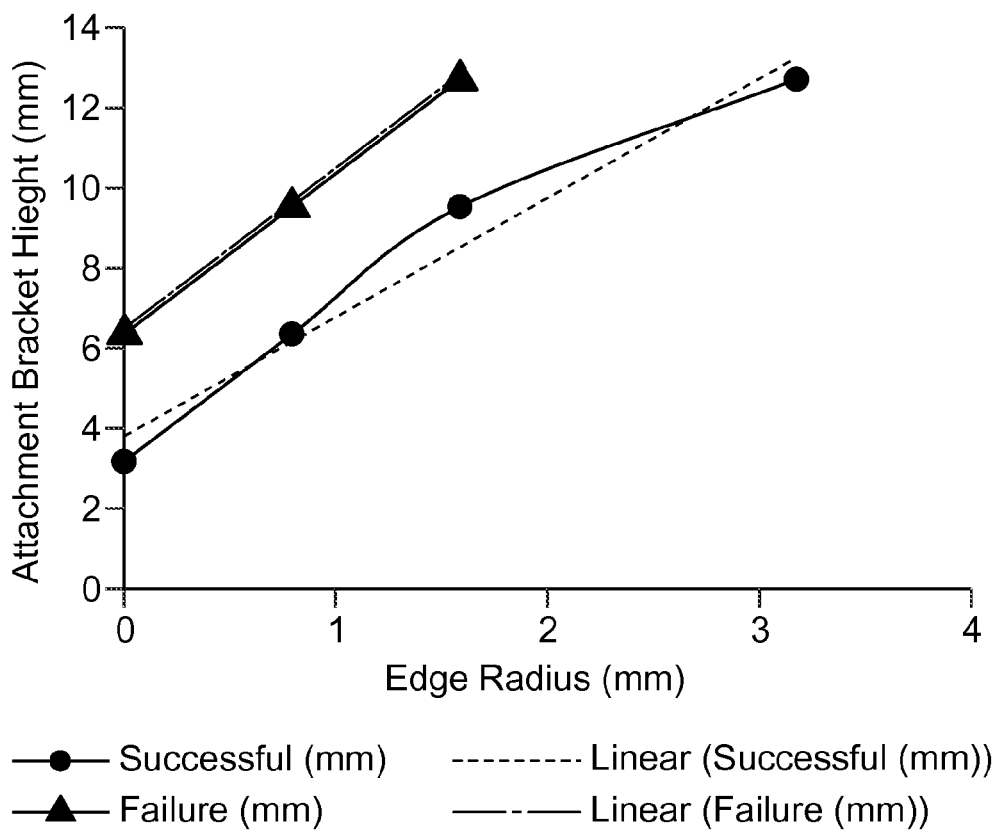
FIG. 14 is a plot of attachment bracket height vs attachment bracket edge radius.

FIG. 14 presents the data from Table 10 in graphical form. The region above the line corresponds to combinations of

We claim:

1. A method of affixing an attachment bracket to a solar module comprising:

providing a pre-lamination solar module comprising:
one or more photovoltaic cells each comprising a first major surface and a second major surface,
a glazing pane adjacent one of the major surfaces of the one or more photovoltaic cells, providing an attachment bracket, providing a thermosettable adhesive composition, forming a solar module assembly by positioning the thermosettable adhesive composition between the glazing pane of the pre-lamination solar module and the attachment bracket, and heating the solar module assembly, thereby forming a bond between the glazing pane and the attachment bracket via the thermosettable adhesive composition.

2. The method according to claim 1, wherein the thermosettable adhesive composition comprises an intermediate bonding composition, wherein the intermediate bonding composition comprises:
- a thermosettable epoxy composition comprising one or more epoxy resins, and
- an acrylic composition comprising the polymerization reaction product of a mixture comprising:
- an acrylic ester, and
- a polymerizable monomer.

3. The method according to claim 2, wherein the thermosettable epoxy composition comprises one or more epoxy resins each comprising di(glycidyl ether) of bisphenol A.

4. The method according to claim 2, wherein the acrylic ester in the acrylic composition is chosen from n-butyl acrylate, hexyl acrylate, 2-ethylhexyl acrylate, octyl acrylate, dodecyl acrylate, lauryl acrylate, octadecyl acrylate, and mixtures thereof.

5. The method according to claim 2, wherein the polymerizable monomer in the acrylic composition is chosen from isobornyl acrylate, N-vinyl pyrrolidone, N-vinyl caprolactam, N-vinyl piperidine, N,N-dimethylacrylamide, acrylonitrile, and mixtures thereof.

6. The method according to claim 2, wherein the intermediate bonding composition further comprises one or more additives chosen from adhesion promoters, photoinitiators, acrylate crosslinking agent, hardeners, pigments, curative agents, curing accelerators, and fillers.

7. The method according to claim 2, wherein the intermediate bonding composition comprises from 10% to 40% of the thermosettable epoxy composition by weight with respect to the total weight of the intermediate bonding composition.

8. The method according to claim 1, wherein the thermosettable adhesive composition is a structural bonding tape.

9. The method according to claim 1, wherein the thermosettable adhesive composition is a pressure sensitive adhesive.

10. The method according to claim 1, wherein the thermosettable adhesive composition further comprises one or more support materials chosen from glass beads, glass bubbles, fibers, wires, non-woven scrims, and meshes.

11. The method according to claim 1, wherein the solar module assembly shows bowing after 7 days in the glass panel bowing test from 0 mm to 2.5 mm.

12. The method according to claim 1, wherein the thermosettable adhesive composition is a structural bonding tape and the structural bonding tape has a stress at 100% strain in the overlap shear stress strain test from 0 N/cm$^2$ to 150 N/cm$^2$.

13. The method according to claim 1, wherein the thermosettable adhesive composition is a structural bonding tape and the structural bonding tape has a pluck adhesion in the pluck adhesion test from 35 N/cm$^2$ to 350 N/cm$^2$.

14. The method according to claim 1, wherein the thermosettable adhesive composition is a structural bonding tape and the structural bonding tape has a storage modulus at 25° C. from 0.5 MPa to 30 MPa.

15. The method according to claim 1, wherein the heating occurs at temperatures form 100° C. to 200° C.

* * * * *